(12) United States Patent
Fujii

(10) Patent No.: US 8,018,392 B2
(45) Date of Patent: Sep. 13, 2011

(54) ANTENNA ELEMENT AND SEMICONDUCTOR DEVICE

(75) Inventor: Tomoharu Fujii, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 204 days.

(21) Appl. No.: 12/099,983

(22) Filed: Apr. 9, 2008

(65) Prior Publication Data

US 2009/0009402 A1 Jan. 8, 2009

(30) Foreign Application Priority Data

Apr. 10, 2007 (JP) ................................. 2007-102501

(51) Int. Cl.
*H01Q 21/00* (2006.01)
(52) U.S. Cl. ........................................ 343/853; 343/700
(58) Field of Classification Search ........... 343/700 MS, 343/702, 853
See application file for complete search history.

(56) References Cited

U.S. PATENT DOCUMENTS

| | | | | |
|---|---|---|---|---|
| 7,724,109 | B2* | 5/2010 | Knecht et al. | 333/204 |
| 2007/0080888 | A1* | 4/2007 | Mohamadi | 343/853 |
| 2009/0040734 | A1* | 2/2009 | Ochi et al. | 361/737 |
| 2009/0102728 | A1* | 4/2009 | Gamand | 343/702 |

FOREIGN PATENT DOCUMENTS

| | | |
|---|---|---|
| JP | 2001-119224 | 4/2001 |
| JP | 2004-022667 | 1/2004 |

* cited by examiner

*Primary Examiner* — Jacob Y Choi
*Assistant Examiner* — Kyana R Robinson
(74) *Attorney, Agent, or Firm* — Drinker Biddle & Reath LLP

(57) ABSTRACT

An antenna element includes: a radio transceiver that transmits and receives a radio wave; a signal input pad; a ground layer; an antenna that has a connection portion for electrically connecting the radio transceiver to the ground layer and the signal input pad; a silicon substrate on which the antenna is formed; and an insulating film for electrically insulating the silicon substrate from the antenna. The radio transceiver is disposed on a first surface of the silicon substrate with the insulating film interposed therebetween. The ground layer and the signal input pad are disposed on a second surface of the silicon substrate opposite to the first surface thereof with the insulating film interposed therebetween. The connection portion is disposed to penetrate the silicon substrate.

4 Claims, 18 Drawing Sheets

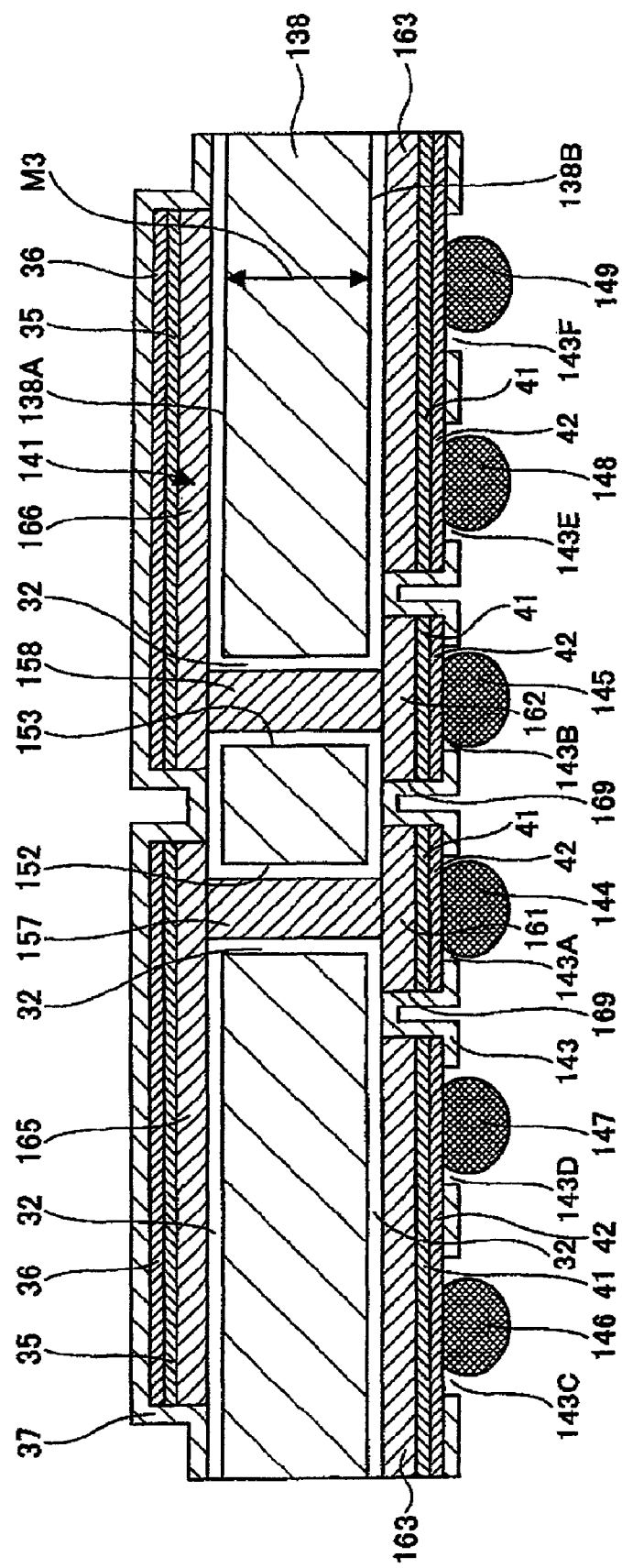

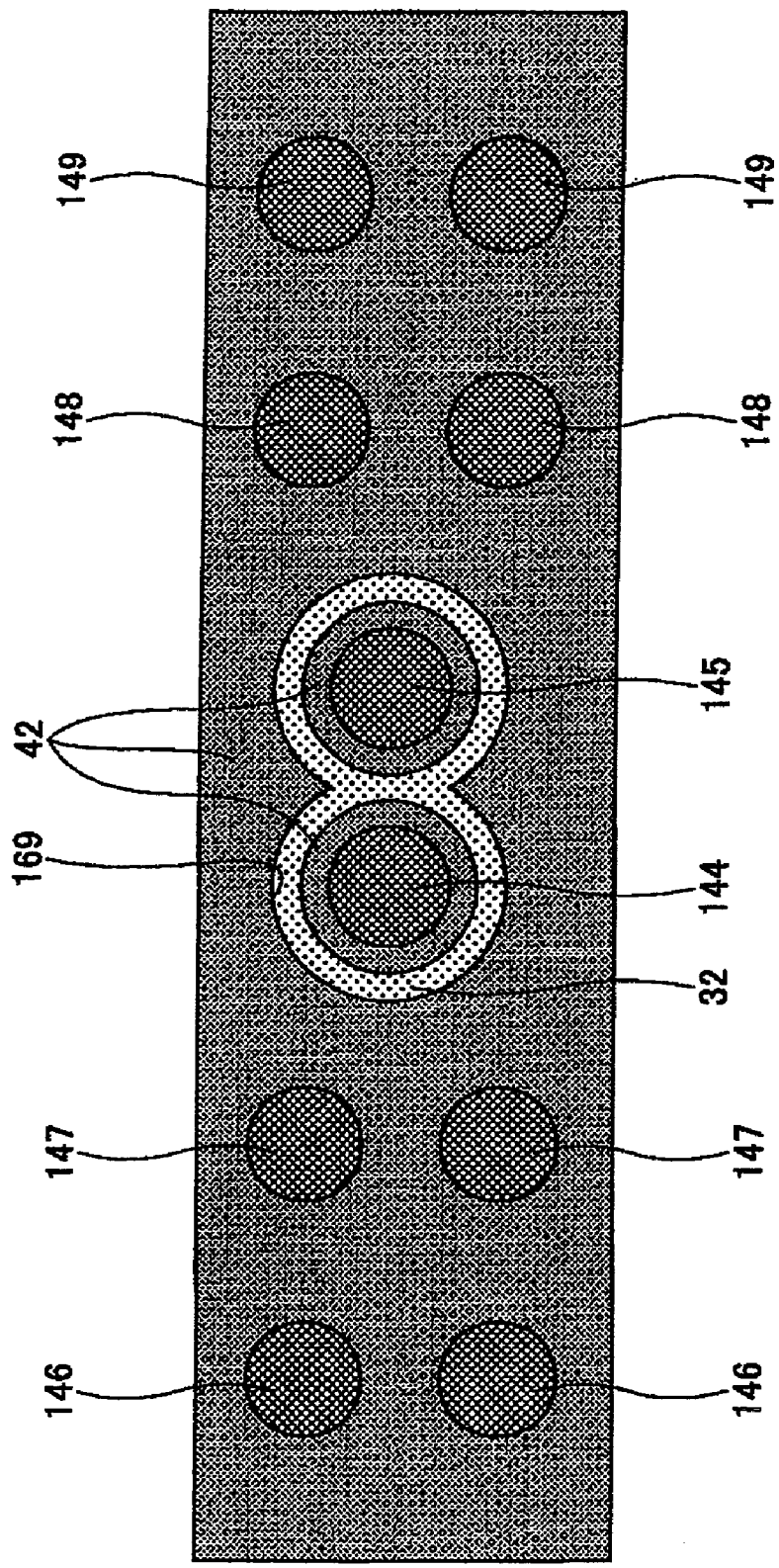

US 8,018,392 B2

ANTENNA ELEMENT AND SEMICONDUCTOR DEVICE

This application is based on and claims priority from Japanese Patent Applications No. 2007-102501, filed on Apr. 10, 2007, the entire contents of which are hereby incorporated by reference.

BACKGROUND OF THE INVENTION

1. Technical Field

The present disclosure relates to an antenna element and a semiconductor device, particularly, to an antenna element and a semiconductor device used in wireless communication.

2. Background Art

In semiconductor devices used as a module for wireless communication, a semiconductor device has been known which has an antenna element or an antenna pattern as shown in FIGS. 1 and 2.

FIG. 1 is a cross-sectional view illustrating the semiconductor device in the related art.

Referring to FIG. 1, a semiconductor device 200 includes a wiring substrate 201, an electronic component such as a CPU chip 203, an RF device 204, and matching components 205 and 206, and an antenna element such as a chip antenna 208.

The wiring substrate 201 has a substrate body 211 and wires 213 to 218. The substrate body 211 is a substrate for forming the wires 213 to 218. The substrate body 211 may be made of resin. The wires 213 to 218 are disposed on the substrate body 211.

The CPU chip 203 is flip-chip bonded to the wires 213 and 214. The RF device 204 is flip-chip bonded to the wires 214 and 215. The RF device 204 is electrically connected to the CPU chip 203 through the wire 214.

The matching component 205 is formed on the wiring substrate 201, and is electrically connected with the wires 215 and 216. The matching component 205 is electrically connected to the RF device 204 through the wire 215. The matching component 206 is disposed on the wiring substrate 201, and is electrically connected with the wires 216 and 217. The matching component 206 is electrically connected to the matching component 205 through the wire 216. The matching components 205 and 206 are components for adjusting impedance of the chip antenna.

The chip antenna 208 is disposed on the wiring substrate 201, and is electrically connected with the wires 217 and 218. The chip antenna 208 is electrically connected with the matching components 205 and 206. The chip antenna 208 is a component thicker in thickness than the CPU chip 203, the RF device 204, and the matching components 205 and 206. For example, a plurality of green sheets (which are changed into a ceramic plate after a sintering process) having conductors (which are changed into an antenna after the sintering process) formed thereon are laminated and subsequently the laminated plurality of green sheets are sintered, and thus the chip antenna 208 can be formed. (see e.g., Japanese Unexamined Patent Application Publication No. 2001-119224)

FIG. 2 is a cross-sectional view illustrating another semiconductor device in the related art. In FIG. 2, the same elements as the semiconductor device 200 shown in FIG. 1 will be referenced by the same reference numerals and signs.

Referring to FIG. 2, another semiconductor device 220 includes a wiring substrate 221, electronic components such as a CPU chip 203 and an RF device 204, and an antenna element such as an antenna pattern 223.

The wiring substrate 221 has a substrate body 211 made of resin and wires 213 to 215. The antenna pattern 223 is disposed on the substrate body 211. The antenna pattern 223 is formed by a wiring pattern. The antenna pattern 223 is connected to the wire 215. The antenna pattern 223 is electrically connected to the RF device 204 through the wire 215. A thickness of the antenna pattern 223 may be set to, for example, 20 µm to 30 µm. In addition, when the semiconductor device 220 is used at a frequency of 2.4 GHz, dimension of the antenna pattern 223 in plan view may be set to 10 mm×24 mm (see e.g., Japanese Unexamined Patent Application Publication No. 2004-22667).

However, since the chip antenna 208 is formed by laminating a plurality of ceramic plates having conductors formed thereon, there is a problem that it is difficult to decrease a size in thickness direction thereof.

In addition, when the chip antenna 208 is used as an antenna element, a size increases in thickness direction of the semiconductor device 200. Thus, it is difficult to decrease the size in thickness direction of the semiconductor device 200.

In addition, in the semiconductor device 220 in which the antenna pattern 223 is used as an antenna element, the matching components 205 and 206 are not required. Thus, it is possible to decrease the size of the semiconductor device 220 to be smaller than the size of the semiconductor device 200 in the thickness direction. However, since the antenna pattern 223 is formed on the substrate body 211 made of resin (a dielectric constant of resin is 4) having a low dielectric constant, a size of the antenna pattern 223 formed on the substrate body 211 increases in surface direction thereof. Therefore, there is a problem that it is difficult to decrease a size in surface direction of the semiconductor device 220.

SUMMARY OF THE INVENTION

Exemplary embodiments of the present invention provide an antenna element and a semiconductor device capable of achieving miniaturization.

According to one or more aspects of the present invention, an antenna element includes: a radio transceiver that transmits and receives a radio wave; a signal input pad; a ground layer; an antenna that has a connection portion for electrically connecting the radio transceiver to the ground layer and the signal input pad; a silicon substrate on which the antenna is formed; and an insulating film for electrically insulating the silicon substrate from the antenna, wherein the radio transceiver is disposed on a first surface of the silicon substrate with the insulating film interposed therebetween, and the ground layer and the signal input pad are disposed on a second surface of the silicon substrate opposite to the first surface thereof with the insulating film interposed therebetween, and wherein the connection portion is disposed to penetrate the silicon substrate.

According to the present invention, it is possible to achieve miniaturization of the antenna element, as compared with a known antenna element of which an antenna is formed on only one surface of a substrate.

Moreover, since the antenna is formed on the silicon substrate, accuracy in processing the antenna is improved, as compared with a known antenna element of which an antenna is formed on a resin substrate. Therefore, it is possible to form the antenna in a desired shape. With such a configuration, it is possible to obtain desired antenna characteristics.

According to one or more aspects of the present invention, an antenna element includes: a radio transceiver that transmits and receives a radio wave; a signal input pad; a ground layer; an antenna that has a connection portion for electrically connecting the radio transceiver to the signal input pad; a silicon substrate on which the antenna is formed; and an insulating film for electrically insulating the silicon substrate from the antenna, wherein the radio transceiver is disposed on a first surface of the silicon substrate with the insulating film interposed therebetween, and the ground layer and the signal input pad are disposed on a second surface of the silicon substrate opposite to the first surface thereof with the insulating film interposed therebetween, and wherein the connection portion is disposed to penetrate the silicon substrate.

According to the present invention, it is possible to achieve miniaturization of the antenna element, as compared with a known antenna element of which an antenna is formed on only one surface of a substrate body.

Moreover, since the antenna is formed on the silicon substrate, accuracy in processing the antenna is improved, as compared with a known antenna element of which an antenna is formed on a resin substrate. Therefore, it is possible to form the antenna in a desired shape. With such a configuration, it is possible to obtain desired antenna characteristics.

According to one or more aspects of the present invention, the antenna may be formed of a plated film. With such a configuration, it is possible to improve accuracy in processing the antenna.

According to one or more aspects of the present invention, a semiconductor device includes: the above-described antenna element; an electronic component that is electrically connected to the antenna element; and a wiring substrate on which the antenna element and the electronic component are mounted.

According to the present invention, it is possible to achieve miniaturization of the semiconductor device.

Other aspects and advantages of the invention will be apparent from the following description, the drawings and the claims.

BRIEF DESCRIPTION OF THE DRAWINGS

FIG. 16 is an enlarged sectional view illustrating the antenna element shown in FIG. 15;

FIG. 17 is a top plan view (#1) illustrating the antenna element shown in FIG. 16; and FIG. 18 is a top plan view (#2) illustrating the antenna element shown in FIG. 16.

DETAILED DESCRIPTION

Hereinafter, exemplary embodiments of the present invention will be described with reference to the drawings.

First Embodiment

Figure 1:
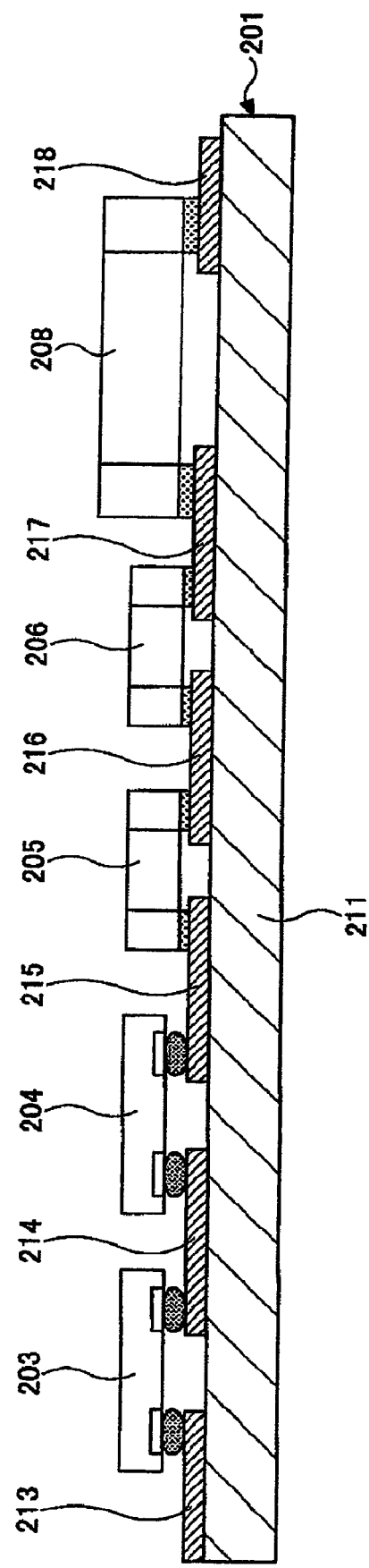
FIG. 1 is a cross-sectional view illustrating a semiconductor device in the related art.
Figure 2:
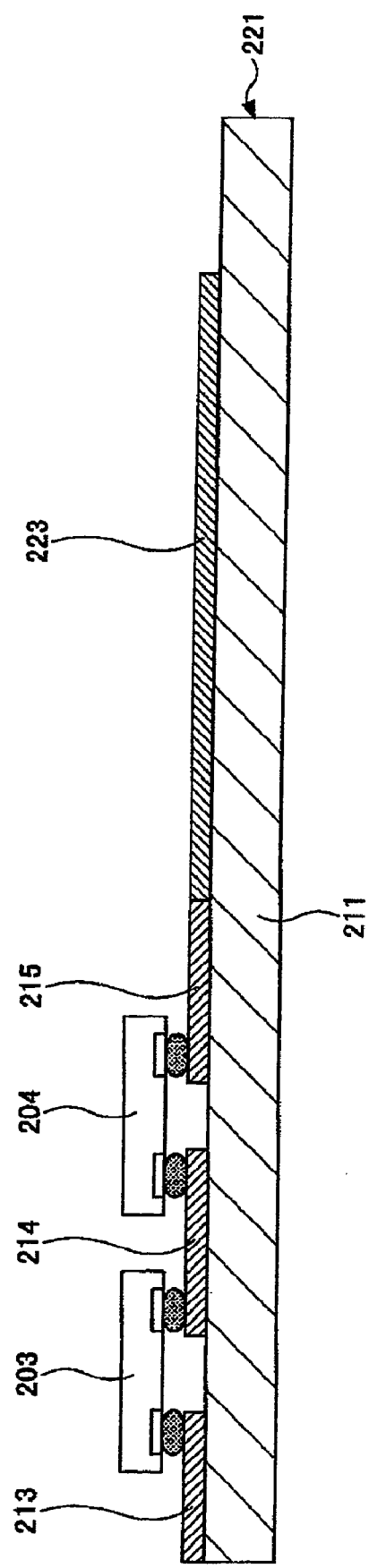
FIG. 2 is a cross-sectional view illustrating another semiconductor device in the related art.
Figure 3:
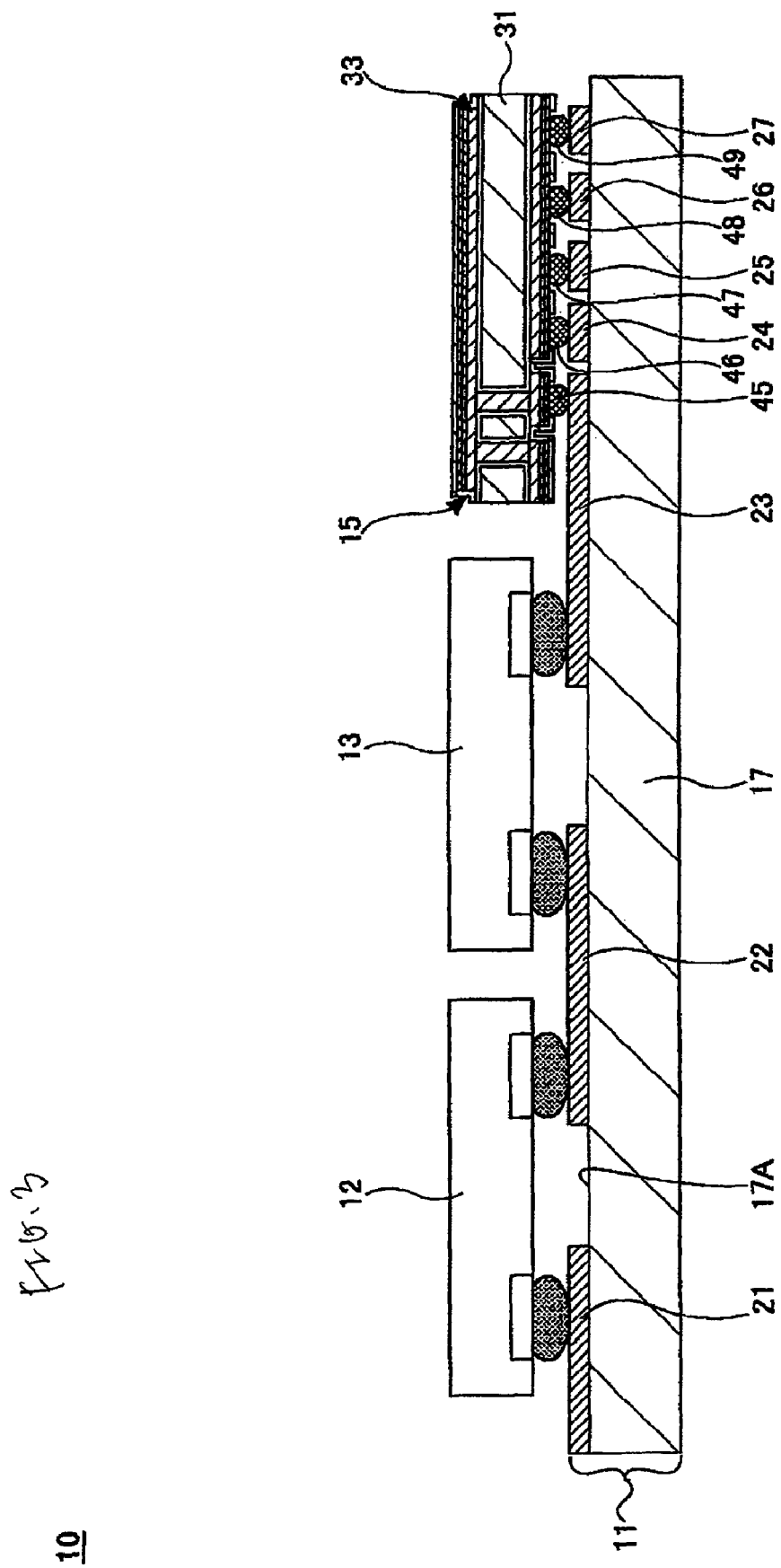
FIG. 3 is a cross-sectional view illustrating a semiconductor device according to a first embodiment of the present invention.

FIG. 3 is a cross-sectional view illustrating a semiconductor device according to a first embodiment of the invention.

Referring to FIG. 3, a semiconductor device 10 according to the first embodiment includes a wiring substrate 11, electronic components such as a CPU chip 12 and an RF device 13, and an antenna element 15.

The wiring substrate 11 has a substrate body 17 and wires 21 to 27. The substrate body 17 is formed in a plate shape. The substrate body 17 is a substrate for forming the wires 21 to 27 thereon. The wires 21 to 27 are disposed on an upper surface 17A of the substrate body 17. The wiring substrate 11 electrically connects the CPU chip 12, the RF device 13, and the antenna element 15 to each other.

The CPU chip 12 is mounted on an upper surface of the wiring substrate 11. The CPU chip 12 is electrically connected to the wires 21 and 22. The CPU chip 12 is a chip for processing data.

The RF device 13 is mounted on the upper surface of the wiring substrate 11, and is electrically connected with the wires 22 and 23. The RF device 13 is electrically connected with the CPU chip 12 through the wire 22. The RF device 13 is a device for modulating and demodulating a signal.

Figure 4:
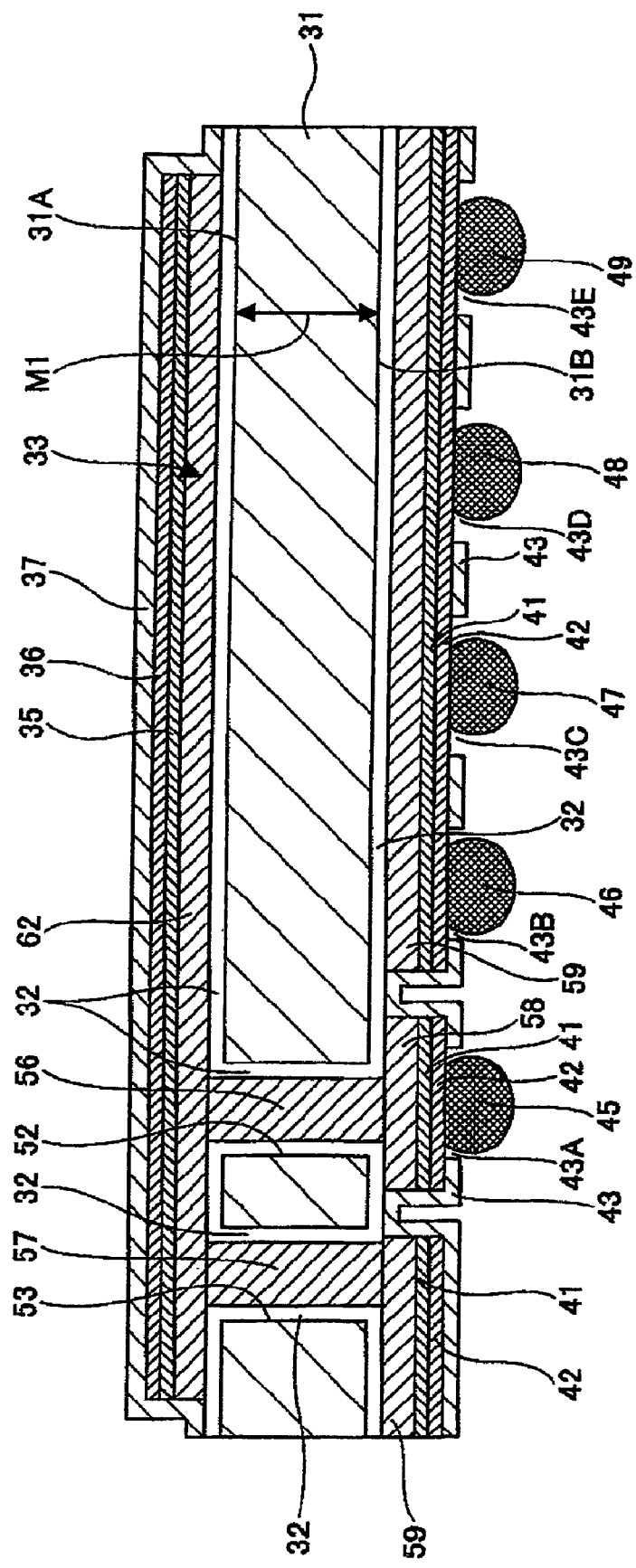
FIG. 4 is an enlarged sectional view illustrating the antenna element shown in FIG. 3.
Figure 5:
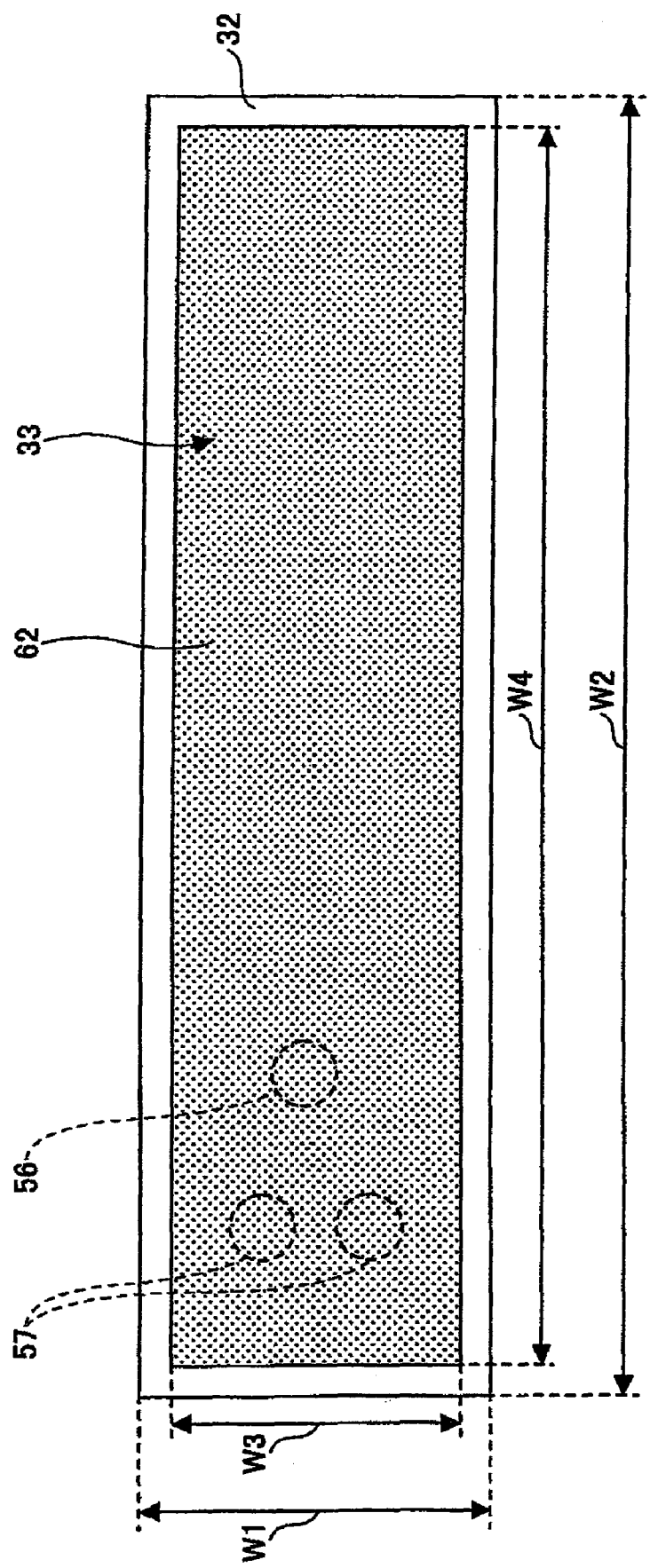
FIG. 5 is a top plan view (#1) illustrating the antenna element shown in FIG. 4.
Figure 6:
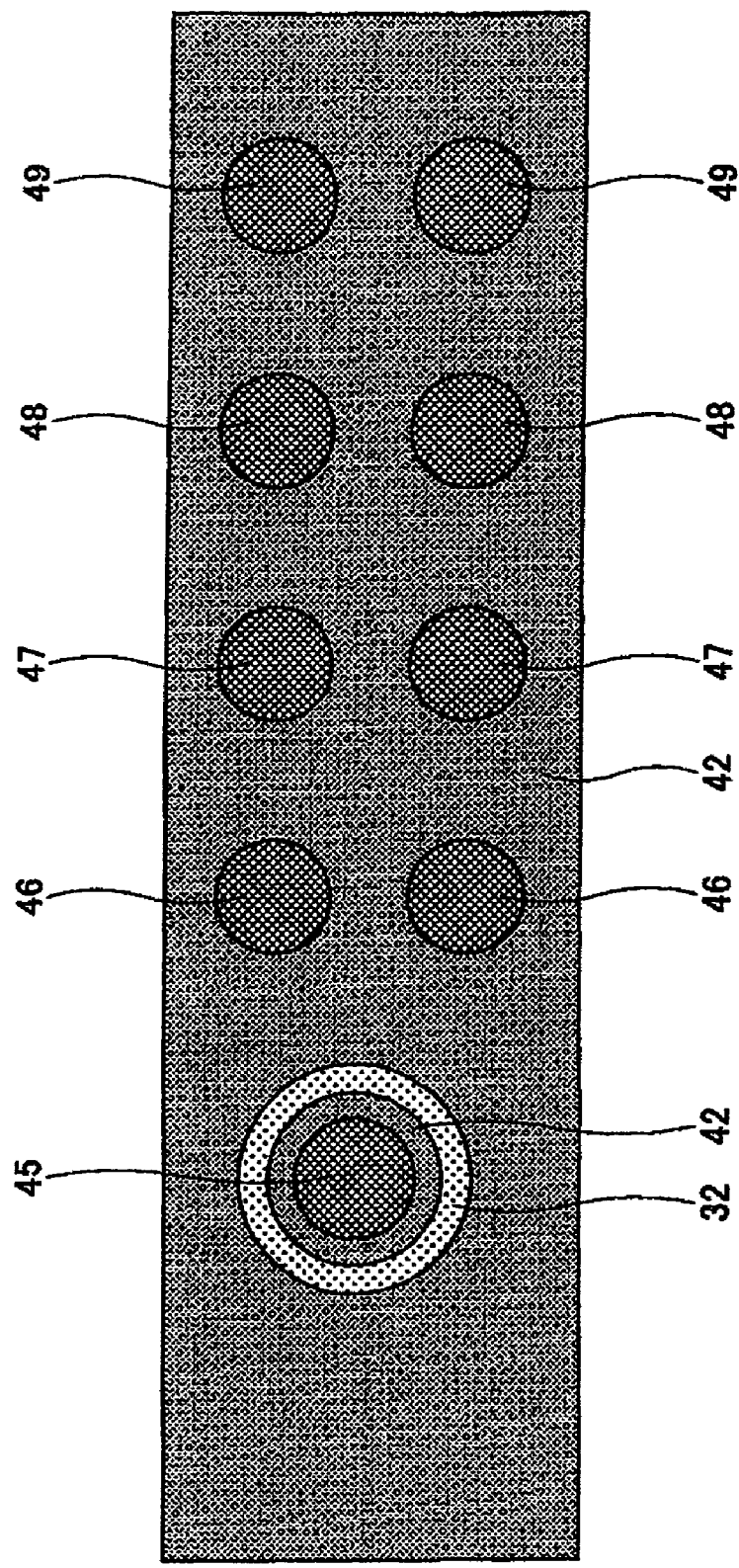
FIG. 6 is a top plan view (#2) illustrating the antenna element shown in FIG. 4.

FIG. 4 is an enlarged sectional view illustrating the antenna element shown in FIG. 3. FIGS. 5 and 6 are top plan views illustrating the antenna element shown in FIG. 4. In FIG. 5, a solder resist 37, a Ni layer 35, and an Au layer 36 are not shown for explanatory convenience. In addition, in FIG. 6, a solder resist 43 is not shown for explanatory convenience.

Referring to FIGS. 4 to 6, the antenna element 15 includes a silicon substrate 31, an insulating film 32, a reverse F-type antenna 33 serving as an antenna, Ni layers 35 and 41, Au layers 36 and 42, solder resists 37 and 43, and external connection terminals 45 to 49.

The silicon substrate 31 is formed in a plate shape. The silicon substrate 31 has through holes 52 and 53. The through holes 52 and 53 are formed to penetrate the silicon substrate 31. The silicon substrate 31 has a larger dielectric constant (a dielectric constant of silicon is normally about 11) than a dielectric constant of resin (a dielectric constant of resin is normally about 4). A thickness M1 of the silicon substrate 31 may be set to, for example, 200 μm to 500 μm. A width W1 of the silicon substrate 31 may be, for example, set larger than a width W3 of a radio transceiver 62 by 0.1 mm. In addition, a width W2 of the silicon substrate 31 may be, for example, set larger than a width W4 of a radio transceiver 62 by 0.1 mm.

The insulating film 32 is provided to cover both surfaces 31A and 31B of the silicon substrate 31 and surfaces of the silicon substrate 31 corresponding to the through holes 52 and 53. The insulating film 32 is a film for electrically insulating the reverse F-type antenna 33 from the silicon substrate 31.

For example, oxide films such as $SiO_2$ may be used as the insulating film 32. A thickness of the insulating film 32 may be set to, for example, several tens of nm to several hundreds of nm, when an oxide film is used as the insulating film 32.

The reverse F-type antenna 33 includes connection portions 56 and 57, a signal input pad 58, a ground layer 59, and the radio transceiver 62. The connection portion 56 is provided in the through hole 52 on which the insulating film 32 is formed. The connection portion 57 is provided in the through hole 53 on which the insulating film 32 is formed. For example, Cu may be used as a material of the connection portions 56 and 57.

The signal input pad 58 is disposed on a lower end surface of the connection portion 56 and a lower surface of the insulating film 32 (a part of the insulating film 32 that is formed on a lower surface 31B of the silicon substrate 31) in the vicinity thereof. The signal input pad 58 is formed in a circular shape in plan view. The signal input pad 58 is connected to a lower end portion of the connection portion 56. To the signal input pad 58, a signal is inputted through the external connection terminal 45, Ni layer 41, and Au layer 42. For example, Cu may be used as a material of the signal input pad 58.

The ground layer 59 is separated from the signal input pad 58, and is provided to cover the lower surface (except for a part of the lower surface of the insulating film 32 corresponding to an region on which the signal input pad 58 is formed) of the insulating film 32 that is formed on the lower surface 31B (a second surface) of the silicon substrate 31. The ground layer 59 is connected to a lower end portion of the connection portion 57. The ground layer 59 is at ground potential. For example, Cu may be used as a material of the ground layer 59.

The radio transceiver 62 is disposed on the insulating film 32 formed on the upper surface 31A (a first surface) of the silicon substrate 31. The radio transceiver 62 is connected to upper end portions of the connection portions 56 and 57. The radio transceiver 62 is electrically connected to the signal input pad 58 through the connection portion 56, and is also electrically connected to the ground layer 59 through the connection portion 57. The radio transceiver 62 transmits and receives a radio wave. For example, Cu may be used as a material of the radio transceiver 62. When the antenna element 15 is used at a frequency of 2.4 GHz, the width W3 of the radio transceiver 62 may be set to, for example, 1 mm to 10 mm, and the width W4 of the radio transceiver 62 may be set to, for example, 15 mm. In this case, a thickness of the radio transceiver 62 may be set to, for example, 10 µm.

As described above, the radio transceiver 62 is disposed on the upper surface 31A of the silicon substrate 31 with the insulating film 32 interposed therebetween, and the signal input pad 58 and the ground layer 59 are disposed on the lower surface 31B of the silicon substrate 31 with the insulating film 32 interposed therebetween. The connection portions 56 and 57 are provided to penetrate the silicon substrate 31, and electrically connects the signal input pad 58 and the ground layer 59 to the radio transceiver 62. Therefore, it is possible to decrease a size of the antenna element 15, as compared with the antenna element 220 in the related art, in which the antenna pattern 223 is formed on one surface of the substrate body 211.

In addition, the reverse F-type antenna 33 is formed on the silicon substrate 31 (a dielectric constant of silicon is normally about 11) having a larger dielectric constant than a dielectric constant of resin (a dielectric constant of resin is normally about 4). Thus, it is possible to decrease the widths W3 and W4 of the radio transceiver 62, as compared with the case where the reverse F-type antenna 33 is formed on a substrate made of resin.

In addition, the reverse F-type antenna 33 is formed on the silicon substrate 31, and thus accuracy in fabricating the reverse F-type antenna 33 improves, as compared with the case where the reverse F-type antenna 33 is formed on a substrate made of resin. Therefore, it is possible to form the reverse F-type antenna 33 in a desired shape (size). With such a configuration, it is possible to obtain desired antenna characteristics in the reverse F-type antenna 33. Particularly, it is effective to a case where the antenna element 15 is used in a high frequency band (for example, 60 GHz) and a millimeter frequency band in which size accuracy of antenna is required.

The reverse F-type antenna 33 may be formed of, for example, a plated film. With such a configuration, since the reverse F-type antenna 33 is formed of the plated film, it is possible to improve accuracy (size accuracy) for processing the reverse F-type antenna 33.

Each dimension tolerance of a metal pattern in forming the metal pattern either on a build-up substrate made of resin or on the silicon substrate is shown in Table 1. Moreover, each calculation result of frequency change at 2.4 GHz and 60 GHz, caused by the dimension tolerance (dimension error), is shown in Table 1.

TABLE 1

|  | Dimension tolerance | dielectric constant | Frequency change at 2.4 GHz (within Dimension tolerance) | Frequency change at 60 GHz (within Dimension tolerance |
|---|---|---|---|---|
| Build-up substrate (resin) | ±3 µm | 4 | ±400 kHz | ±240 MHz |
| Si | ±0.5 µm | 10 | ±54 kHz | ±33 Mhz |

As shown in Table 1, the dimension tolerance of the metal pattern is within 3 µm in using the build-up substrate, while the dimension tolerance is within 0.5 µm in using the silicon substrate. In the build-up substrate, each of the frequency change at 2.4 GHz and 60 GHz is within 400 kHz and 240 kHz. Meanwhile, in the silicon substrate, each of the frequency change at 2.4 GHz and 60 GHz is within 54 kHz and 33 kHz. That is, it can be seen that the frequency change of the build-up substrate is about 8 times as large as that of the silicon substrate.

This means that since dimension tolerance (dimension error) of the silicon substrate is smaller than that of the build-up substrate, the silicon substrate is effective to the antenna element 15 used at high frequency band (e.g., 60 GHz) and millimeter frequency band in which size accuracy of antenna is required.

The Ni layer 35 is provided to cover the upper surface of the radio transceiver 62. The Ni layer 35 is a diffusion preventing layer for preventing Cu included in the radio transceiver 62 from diffusing in the Au layer 36. A thickness of the Ni layer 35 may be set to, for example, 1 µm to 4 µm. The Ni layer 35 and the Au layer 36 may be formed, for example, by a plating method.

The Au layer 36 is provided to cover the upper surface of the Ni layer 35. The Au layer 36 is excellent in corrosion resistance to prevent the Ni layer 35 from oxidation. The Ni layer 35 is a base of the Au layer 36. A thickness of the Au layer 36 may be set to, for example, 0.2 µm to 0.3 µm.

The solder resist 37 is disposed on the insulating film 32 to cover the radio transceiver 62, the Ni layer 35, and the Au layer 36 formed on the insulating film 32. A thickness of the solder resist 37 may be set to, for example, 20 µm.

The Ni layer 41 is provided to cover the lower surface of the signal input pad 58 and the ground layer 59. The Ni layer 41 is a diffusion preventing film for preventing Cu included in the signal input pad 58 and the ground layer 59 from diffusing in the Au layer 42. A thickness of the Ni layer 41 may be set to, for example, 1 µm to 4 µm.

The Au layer 42 is provided to cover the lower surface of the Ni layer 41. Au layer 42 is excellent in corrosion resistance to prevent the Ni layer 41 from oxidation. A thickness of the Au layer 42 may be set to, for example, 0.2 µm to 0.3 µm.

The solder resist 43 is disposed on the insulating film 32 (a part of the insulating film 32 that is formed on a lower surface 31B of the silicon substrate 31) to cover the signal input pad 58, the ground layer 59, the Ni layer 41, and the Au layer 42 formed on the insulating film 32. The solder resist 43 has opening portions 43A to 43E for exposing parts of the Au layer 42 on which external connection terminals 45 to 49 are disposed. A thickness of the solder resist 43 may be set to, for example, 20 µm.

The external connection terminal 45 is disposed on a part of the Au layer 42 exposed by the opening portion 43A. The external connection terminal 45 is a terminal for inputting a signal. A signal inputted from the external connection terminal 45 is transmitted to the radio transceiver 62 through the Au layer 42, the Ni layer 41, the signal input pad 58, and the connection portion 56. In addition, the external connection terminal 45 is connected to the wire 23 disposed on the wiring substrate 11. With such a configuration, the antenna element 15 is electrically connected to the RF device 13 through the wire 23.

The external connection terminal 46 is disposed on a part of the Au layer 42 exposed by the opening portion 43B. The external connection terminal 46 is connected to the wire 24 disposed on the wiring substrate 11. The external connection terminal 47 is disposed on a part of the Au layer 42 exposed by the opening portion 43C. The external connection terminal 47 is connected to the wire 25 disposed on the wiring substrate 11. The external connection terminal 48 is disposed on a part of the Au layer 42 exposed by the opening portion 43D. The external connection terminal 48 is connected to the wire 26 disposed on the wiring substrate 11. The external connection terminal 49 is disposed on a part of the Au layer 42 exposed by the opening portion 43E. The external connection terminal 49 is connected to the wire 27 disposed on the wiring substrate 11. The external connection terminals 46 to 49 are ground terminals.

According to the antenna element of the exemplary embodiment, the radio transceiver 62 is disposed on the upper surface 31A of the silicon substrate 31 with the insulating film 32 interposed therebetween, and the signal input pad 58 and the ground layer 59 are disposed on the lower surface 31B of the silicon substrate 31 with the insulating film 32 interposed therebetween. The connection portions 56 and 57 are provided to penetrate the silicon substrate 31, and electrically connects the signal input pad 58 and the ground layer 59 to the radio transceiver 62. Therefore, it is possible to reduce a size of the antenna element 15, as compared with the known antenna element 220 in which the antenna pattern 223 is formed on one surface of the substrate body 211.

In addition, the reverse F-type antenna 33 is formed on the silicon substrate 31 (a dielectric constant of silicon is normally about 11) having a larger dielectric constant than a dielectric constant of resin (a dielectric constant of resin is normally about 4). Thus, it is possible to reduce the widths W3 and W4 of the radio transceiver 62, as compared with the case where the reverse F-type antenna 33 is formed on a substrate made of resin.

According to a semiconductor device of the exemplary embodiment, there are provided the wiring substrate 11 having the wires 21 to 27, the CPU chip 12 and RF device 13 disposed on the wiring substrate 11, and the antenna element 15 electrically connected to the CPU chip 12 and the RF device 13. Thus, it is possible to reduce a size of the semiconductor device 10.

Second Embodiment

Figure 7:
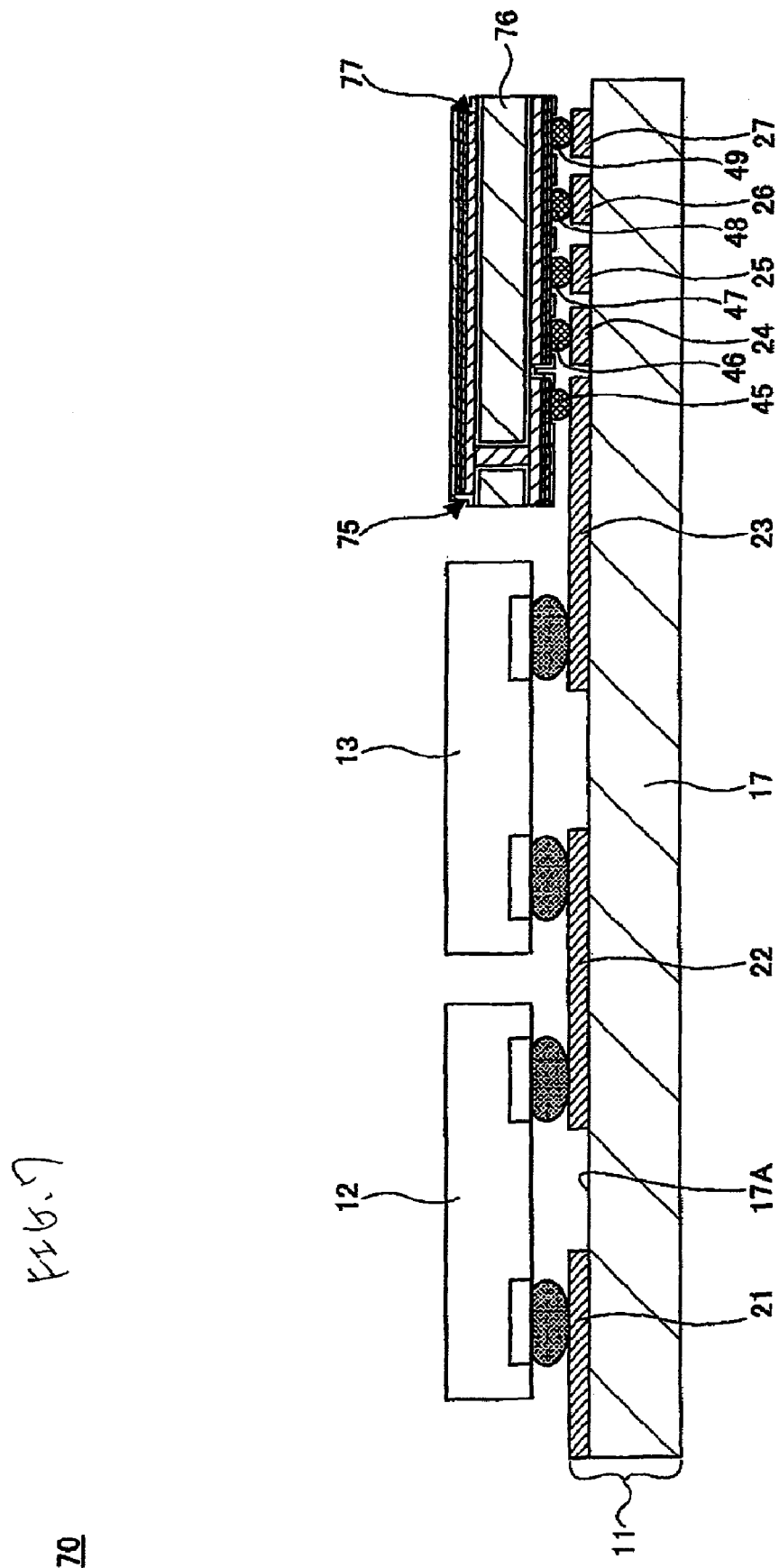
FIG. 7 is a cross-sectional view illustrating a semiconductor device according to a second embodiment of the invention.

FIG. 7 is a cross-sectional view illustrating a semiconductor device according to a second embodiment of the invention. In FIG. 7, the same elements as the semiconductor device 10 of the first embodiment will be referenced by the same reference numerals and signs.

Referring to FIG. 7, a semiconductor device 70 of the second embodiment has the same configuration as the semiconductor device 10 of the first embodiment, other than an antenna element 75 is provided instead of the antenna element 15 disposed on the semiconductor device 10 of the first embodiment.

Figure 8:
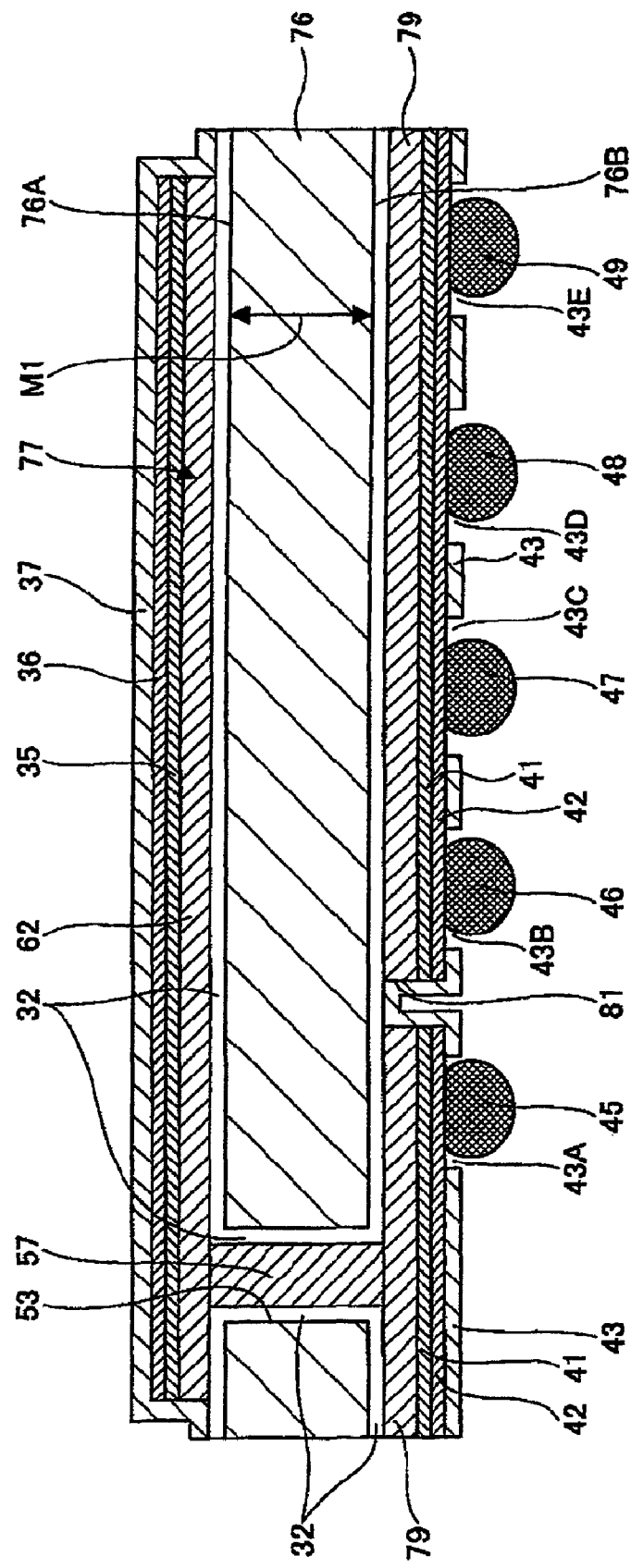
FIG. 8 is an enlarged sectional view illustrating the antenna element shown in FIG. 7.
Figure 9:
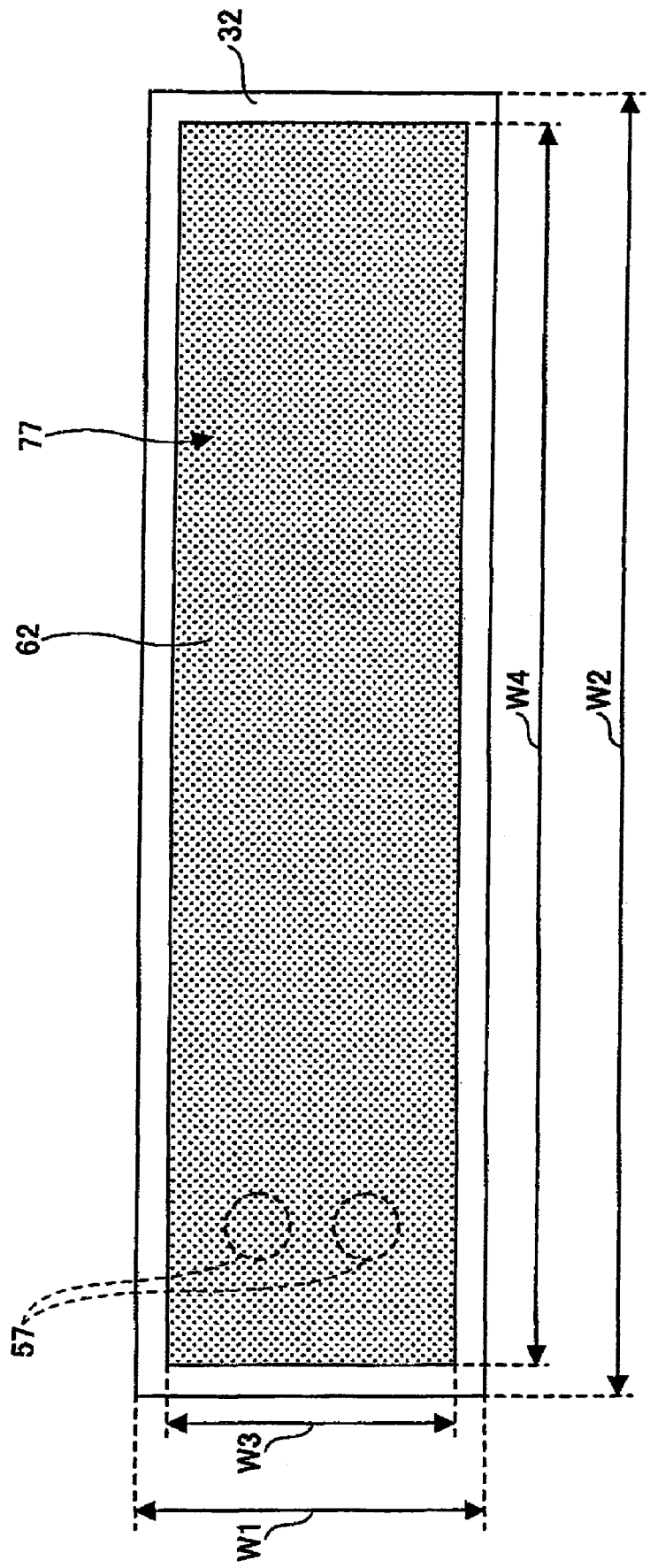
FIG. 9 is a top plan view (#1) illustrating the antenna element shown in FIG. 8.
Figure 10:
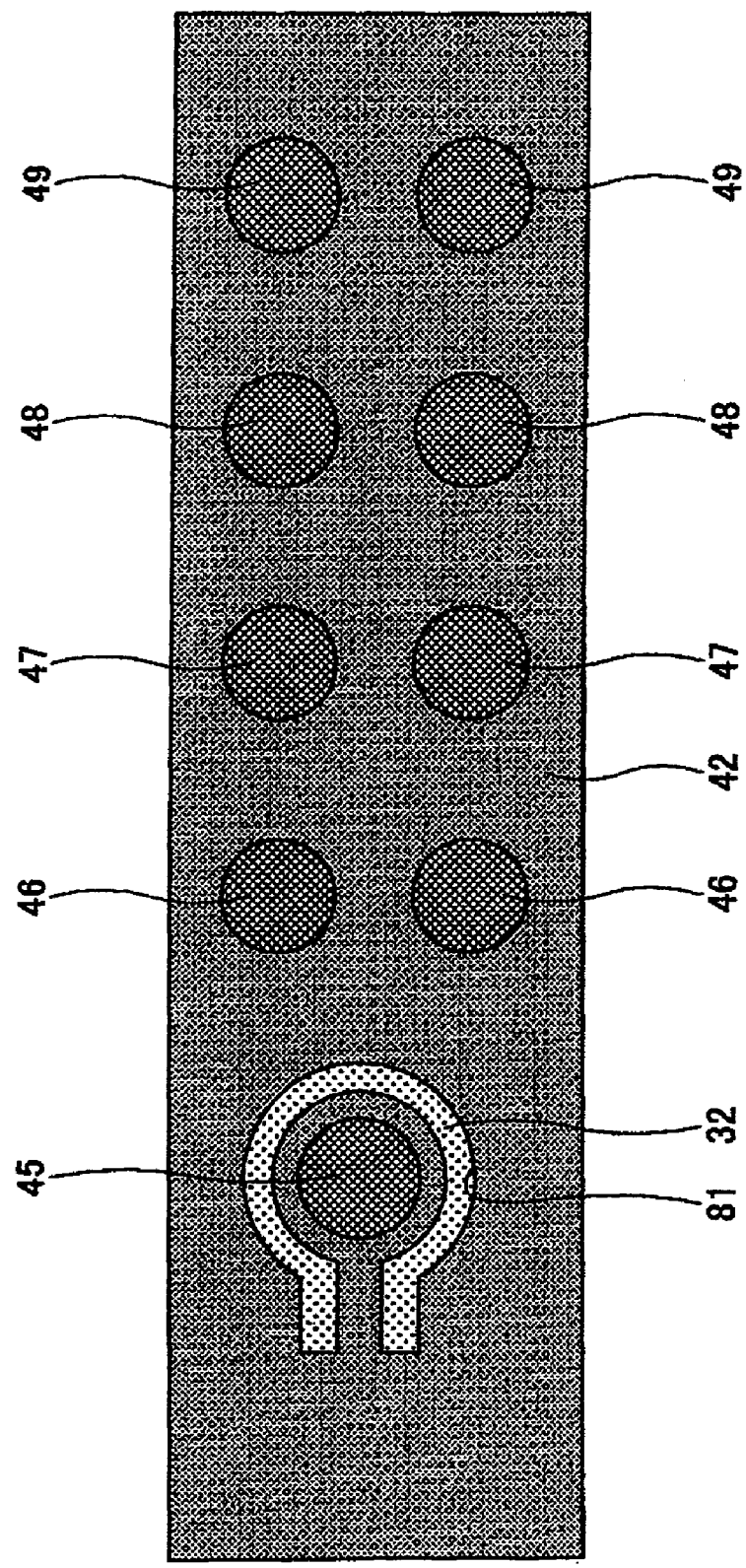
FIG. 10 is a top plan view (#2) illustrating the antenna element shown in FIG. 8.

FIG. 8 is an enlarged sectional view illustrating the antenna element shown in FIG. 7. FIGS. 9 and 10 are top plan views illustrating the antenna element shown in FIG. 8. In FIG. 9, a solder resist 37, a Ni layer 35, and an Au layer 36 are not shown for explanatory convenience. In addition, in FIG. 10, a solder resist 43 is not shown for explanatory convenience.

Referring to FIGS. 8 to 10, an antenna element 75 of the second embodiment has the same configuration as the antenna element 15 of the first embodiment, other than a silicon substrate 76 and a reverse L-type antenna 77 is provided instead of the silicon substrate 31 and the reverse F-type antenna 33 disposed on the antenna element 15 described in the first embodiment.

The silicon substrate 76 has the same configuration as the silicon substrate 31, other than the through hole 52 is removed from the configuration of the silicon substrate 31 described in the first embodiment.

The reverse L-type antenna 77 has the same configuration as the reverse F-type antenna 33, other than the connection portion 56 and the signal input pad 58 is removed from the configuration of the reverse F-type antenna 33 described in the first embodiment and the ground layer 79 is provided instead of the ground layer 59 disposed on the reverse F-type antenna 33.

The radio transceiver 62 is disposed on the insulating film 32 formed on an upper surface 76A (a first surface) of the silicon substrate 76. The radio transceiver 62 is connected to an upper end portion of the connection portion 57.

A ground layer 79 is provided to cover the lower surface of the insulating film 32 formed on a lower surface 76B of the silicon substrate 76. The ground layer 79 has a groove 81 (see FIG. 10) that exposes the insulating film 32 formed on the lower surface 76B of the silicon substrate 76. The ground layer 79 is connected to a lower end portion of a connection portion 57. The ground layer 79 is electrically connected to the radio transceiver 62 through the connection portion 57.

As described above, the radio transceiver 62 is disposed on the upper surface 76A of the silicon substrate 76 with the insulating film 32 interposed therebetween, and the ground layer 79 is disposed on the lower surface 76B of the silicon substrate 76 with the insulating film 32 interposed therebetween. The connection portion 57 is provided to penetrate the silicon substrate 76, and electrically connects the ground layer 79 to the radio transceiver 62. Therefore, it is possible to reduce a size of the antenna element 75, as compared with the known antenna element 220 in which the antenna pattern 223 is formed on one surface of the substrate body 211.

In addition, the reverse L-type antenna 77 is formed on the silicon substrate 76 (a dielectric constant of silicon is normally about 11) having a larger dielectric constant than a dielectric constant of resin (a dielectric constant of resin is normally about 4). Thus, it is possible to reduce the widths W3 and W4 of the radio transceiver 62, as compared with the case where the reverse L-type antenna 77 is formed on a substrate made of resin.

In addition, the reverse L-type antenna 77 is formed on the silicon substrate 76, and thus accuracy in processing the reverse L-type antenna 77 improves, as compared with the case where the reverse L-type antenna 77 is formed on a resin substrate. Therefore, it is possible to form the reverse L-type antenna 77 in a desired shape. With such a configuration, it is possible to obtain desired antenna characteristics in the reverse L-type antenna 77. Particularly, it is effective in a case where the antenna element 75 is used in a high frequency band (for example, 60 GHz) and a millimeter frequency band in which size accuracy of antenna is required.

The reverse L-type antenna 77 may be formed of, for example, a Cu plated film. With such a configuration, since the reverse L-type antenna 77 is formed of the plated film, it is possible to improve accuracy (size accuracy) for processing the reverse L-type antenna 77.

A Ni layer 41 is provided to cover the lower surface of the ground layer 79. An Au layer 42 is provided to cover the lower surface of the Ni layer 41. A solder resist 43 is provide to cover parts of the insulating film 32, the Ni layer 41, the Au layer 42, and the ground layer 79 corresponding to the groove 81 and the lower surface of the Au layer 42. An opening portion 43A of the solder resist 43 is formed on a part of the Au layer 42 surrounded by the groove 81. An external connection terminal 45 is disposed on a part of the Au layer 42 exposed by the opening portion 43A. An external connection terminal 46 is disposed on a part of the Au layer 42 exposed by an opening portion 43B. An external connection terminal 47 is disposed on a part of the Au layer 42 exposed by an opening portion 43C. An external connection terminal 48 is disposed on a part of the Au layer 42 exposed by an opening portion 43D. An external connection terminal 49 is disposed on a part of the Au layer 42 exposed by an opening portion 43E.

In the antenna element 75 configured as described above, a signal is inputted to the ground layer 79 through the external connection terminal 45.

The external connection terminals 45 to 49 of the reverse L-type antenna 77 having the aforementioned configuration are electrically connected to the wires 23 to 27 disposed on the wiring substrate. The reverse L-type antenna 77 is electrically connected to the CPU chip 12 and the RF device 13 mounted on the wiring substrate 11.

As described above, there are provided the wiring substrate 11 having the wires 21 to 27, the CPU chip 12 and RF device 13 disposed on the wiring substrate 11, and the antenna element 75 electrically connected to the CPU chip 12 and the RF device 13. Thus, it is possible to reduce a size of the semiconductor device 70.

According to the antenna element of the exemplary embodiment, the radio transceiver 62 is disposed on the upper surface 76A of the silicon substrate 76 with the insulating film 32 interposed therebetween, and the ground layer 79 are disposed on the lower surface 76B of the silicon substrate 76 with the insulating film 32 interposed therebetween. The connection portion 57 is provided to penetrate the silicon substrate 76, and electrically connects the ground layer 79 to the radio transceiver 62. Therefore, it is possible to reduce a size of the antenna element 75, as compared with the known antenna element 220 in which the antenna pattern 223 is formed on one surface of the substrate body 211.

In addition, the reverse L-type antenna 77 is formed on the silicon substrate 76 (a dielectric constant of silicon is normally about 11) having a larger dielectric constant than a dielectric constant of resin (a dielectric constant of resin is normally about 4). Thus, it is possible to decrease the widths W3 and W4 of the radio transceiver 62, as compared with the case where the reverse L-type antenna 77 is formed on a substrate made of resin.

According to a semiconductor device of the embodiment, there are provided the wiring substrate 11 having the wires 21 to 27, the CPU chip 12 and RF device 13 disposed on the wiring substrate 11, and the antenna element 75 electrically connected to the CPU chip 12 and the RF device 13. Thus, it is possible to reduce a size of the semiconductor device 70.

Third Embodiment

Figure 11:
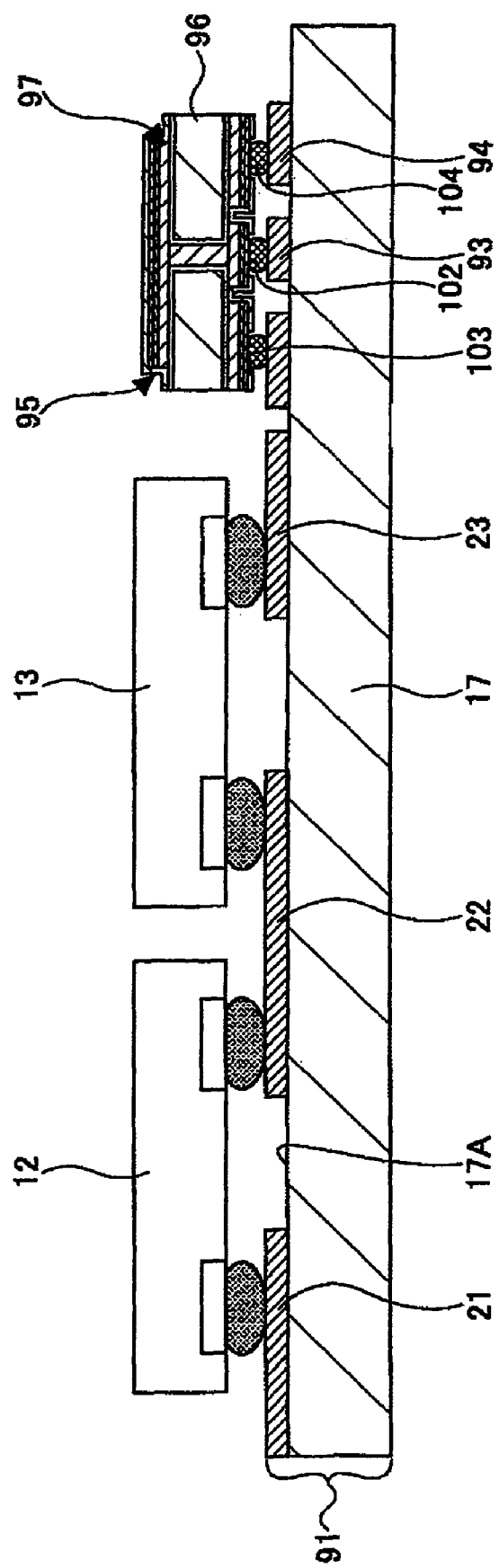
FIG. 11 is a cross-sectional view illustrating a semiconductor device according to a third embodiment of the invention.

FIG. 11 is a cross-sectional view illustrating a semiconductor device according to a third embodiment of the invention. In FIG. 11, the same elements as the semiconductor device 10 of the first embodiment will be referenced by the same reference numerals and signs.

Referring to FIG. 11, a semiconductor device 90 according to the third embodiment of the invention includes a wiring substrate 91, electronic components such as a CPU chip 12 and an RF device 13, and an antenna element 95.

Figure 12:
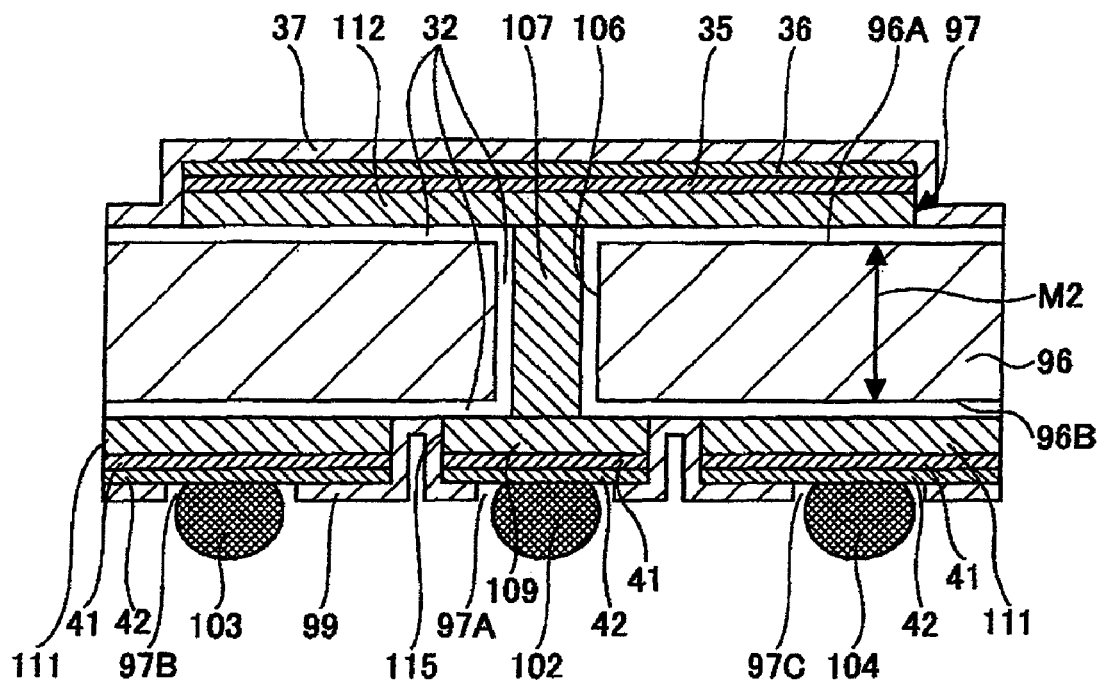
FIG. 12 is an enlarged sectional view illustrating the antenna element shown in FIG. 11.
Figure 13:
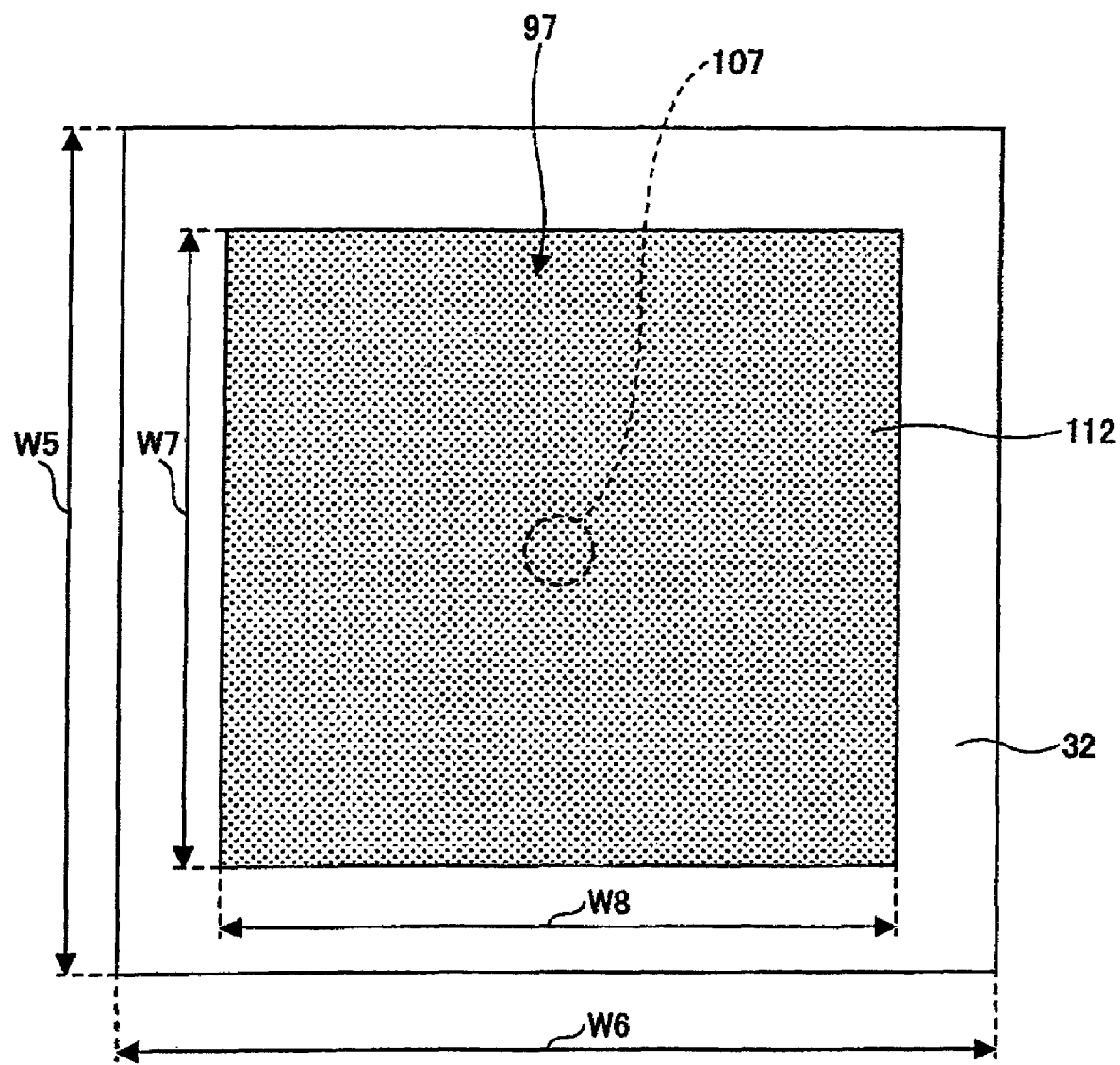
FIG. 13 is a top plan view (#1) illustrating the antenna element shown in FIG. 11.
Figure 14:
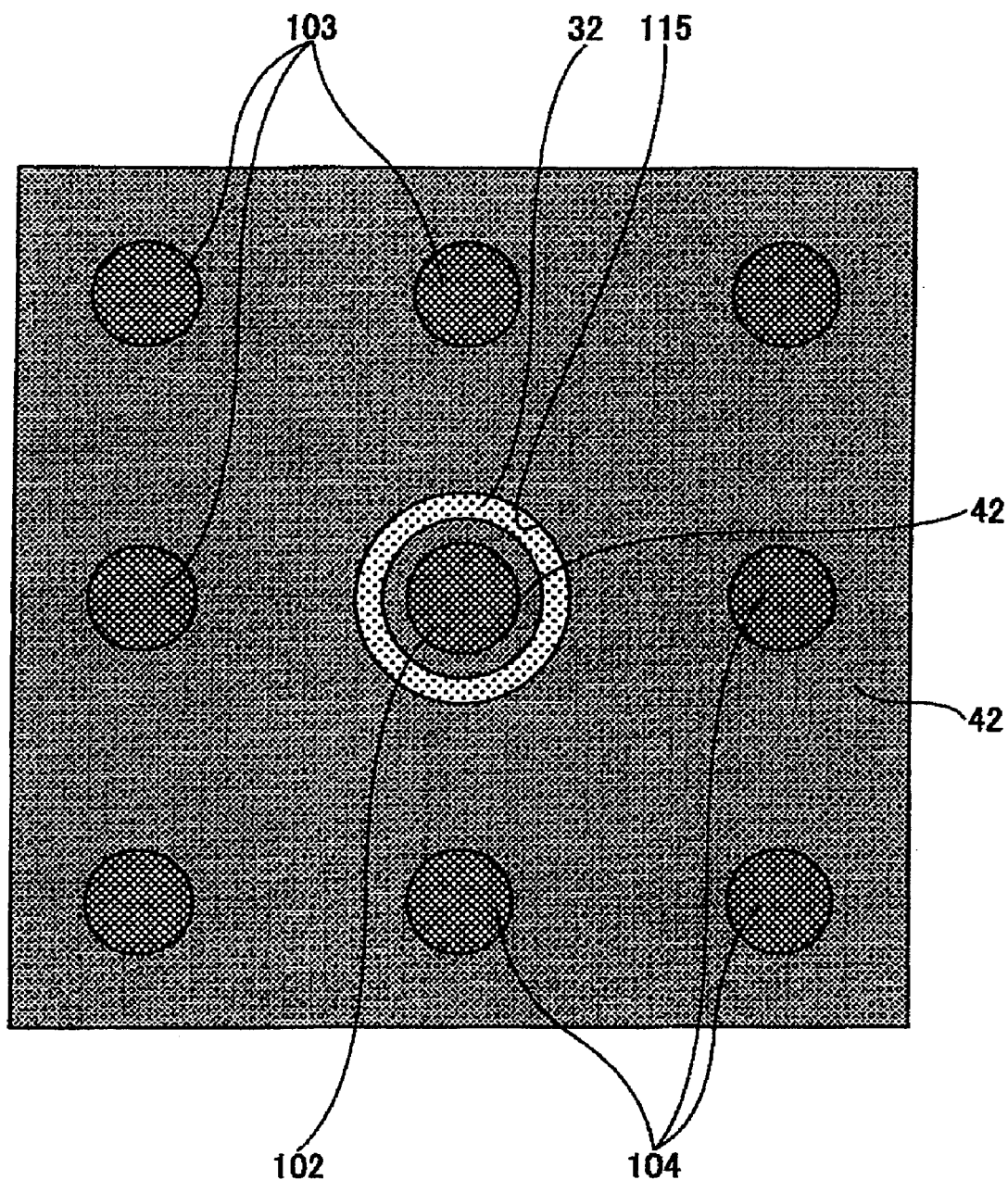
FIG. 14 is a top plan view (#2) illustrating the antenna element shown in FIG. 11.

The wiring substrate 91 has a substrate body 17 and wires 21 to 23, 93, and 94. The wires 21 to 23, 93, and 94 are disposed on an upper surface 17A of the substrate body 17. The wiring substrate 91 is a substrate for electrically connecting the CPU chip 12, the RF device 13, and the antenna element 95 to each other;

FIG. 12 is an enlarged sectional view illustrating the antenna element shown in FIG. 11. FIGS. 13 and 14 are top plan views illustrating the antenna element shown in FIG. 11. In FIGS. 12 to 14, the same elements as the antenna element 15 of the first embodiment will be referenced by the same reference numerals and signs. In FIG. 13, a solder resist 37, a Ni layer 35, and an Au layer 36 are not shown for explanatory convenience. In addition, in FIG. 14, a solder resist 99 is not shown for explanatory convenience.

Referring to FIGS. 12 to 14, the antenna element 95 includes a silicon substrate 96, an insulating film 32, a patch antenna 97 serving as an antenna, Ni layers 35 and 41, Au layers 36 and 42, solder resists 37 and 99, and external connection terminals 102 to 104. The silicon substrate 96 is formed in a plate shape, and has a through hole 106. The through hole 106 is formed to penetrate the silicon substrate 96. A thickness M2 of the silicon substrate 96 may be set to, for example, 200 μm to 500 μm. A width W5 of the silicon substrate 96 may be, for example, set larger than a width W7 of a radio transceiver 112 by 0.1 mm. In addition, a width W6 of the silicon substrate 96 may be, for example, set larger than a width W8 of a radio transceiver 112 by 0.1 mm.

The insulating film 32 is provided to cover both surfaces 96A and 96B of the silicon substrate 96 and surfaces of the silicon substrate 96 corresponding to the through hole 106. The insulating film 32 is used for electrically insulating the patch antenna 97 from the silicon substrate 96.

The patch antenna 97 includes a connection portion 107, a signal input pad 109, a ground layer 111, and the radio transceiver 112. The connection portion 107 is disposed in the through hole 106 on which the insulating film 32 is formed.

For example, Cu may be used as a material of the connection portion 107.

The signal input pad 109 is disposed on a lower end surface of the connection portion 107 and a lower surface of the insulating film 32 (a part of the insulating film 32 that is formed on a lower surface 96B of the silicon substrate 96) in the vicinity thereof. The signal input pad 109 is formed in a circular shape in plan view. The signal input pad 109 is connected to a lower end portion of the connection portion 107. For example, Cu may be used as a material of the signal input pad 109.

The ground layer 111 is separated from the signal input pad 109, and is provided to cover the lower surface (except for a part of the lower surface of the insulating film 32 corresponding to an region on which the signal input pad 109 is formed) of the insulating film 32 that is formed on the lower surface 96B (a second surface) of the silicon substrate 96. Between the ground layer 111 and the signal input pad 109, a groove 115 having a ring shape is formed. The ground layer 111 is at ground potential. For example, Cu may be used as a material of the ground layer 111.

The radio transceiver 112 is disposed on the insulating film 32 formed on the upper surface 96A (a first surface) of the silicon substrate 96. The radio transceiver 112 is connected to an upper end portion of the connection portion 107. The radio transceiver 112 is electrically connected to the signal input pad 109 through the connection portion 107.

The radio transceiver 112 has a role to transmit and receive a radio wave. For example, Cu may be used as a material of the radio transceiver 112. When the antenna element 95 is used at a frequency of 2.4 GHz, the width W7 of the radio transceiver 112 may be set to, for example, 30 mm, and the width W8 of the radio transceiver 112 may be set to, for example, 30 mm. In this case, a thickness of the radio transceiver 112 may be set to, for example, 10 μm.

As described above, the radio transceiver 112 is disposed on the upper surface 96A of the silicon substrate 96 with the insulating film 32 interposed therebetween, and the signal input pad 109 and the ground layer 111 are disposed on the lower surface 96B of the silicon substrate 96 with the insulating film 32 interposed therebetween. The connection portion 107 is provided to penetrate the silicon substrate 96, and electrically connects the signal input pad 109 to the radio transceiver 112. Therefore, it is possible to reduce a size of the antenna element 95, as compared with the known antenna element 220 in which the antenna pattern 223 is formed on one surface of the substrate body 211.

In addition, the patch antenna 97 is formed on the silicon substrate 96 (a dielectric constant of silicon is normally about 11) having a larger dielectric constant than a dielectric constant of resin (a dielectric constant of resin is normally about 4). Thus, it is possible to reduce the widths W7 and W8 of the radio transceiver 112, as compared with the case where the patch antenna 97 is formed on a substrate made of resin.

In addition, the patch antenna 97 is formed on the silicon substrate 96, and thus accuracy in processing the patch antenna 97 improves, as compared with the case where the patch antenna 97 is formed on a substrate made of resin. Therefore, it is possible to form the patch antenna 97 in a desired shape. With such a configuration, it is possible to obtain desired antenna characteristics in the patch antenna 97. Particularly, it is effective to a case where the antenna element 95 is used in a high frequency band (for example, 60 GHz) and a millimeter frequency band in which size accuracy of antenna is required.

The patch antenna 97 may be formed of, for example, a plated film. With such a configuration, since the patch antenna 97 is formed of the plated film, it is possible to improve accuracy (size accuracy) in processing the patch antenna 97.

A Ni layer 35 is provided to cover the upper surface of the radio transceiver 112. An Au layer 36 is provided to cover the upper surface of the Ni layer 35. A solder resist 37 is disposed on the insulating film 32 to cover the radio transceiver 112, the Ni layer 35, and the Au layer 36.

A Ni layer 41 is provided to cover the lower surface of the signal input pad 109 and the ground layer 111. An Au layer 42 is provided to cover the lower surface of the Ni layer 41. A solder resist 99 is provide to cover parts of the insulating film 32, the Ni layer 41, the Au layer 42, and the ground layer 111 corresponding to the groove 115 and the lower surface of the Au layer 42. The solder resist 99 has an opening portion 97A for exposing a part of the Au layer 42 disposed on the lower surface of the signal input pad 109, and opening portions 97B and 97C for exposing parts of the Au layer 42 disposed on the lower surface of the ground layer 111. A thickness of the solder resist 99 may be set to, for example, 20 μm.

The external connection terminal 102 is disposed on a part of the Au layer 42 exposed by the opening portion 97A. The external connection terminal 102 is a terminal for inputting a signal. A signal inputted from the external connection terminal 102 is transmitted to the radio transceiver 112 through the Au layer 42, the Ni layer 41, the signal input pad 109, and the connection portion 107. In addition, the external connection terminal 102 is connected to the wire 93 disposed on the wiring substrate 91.

The external connection terminal 103 is disposed on a part of the Au layer 42 exposed by the opening portion 97B. The external connection terminal 103 is connected to the wire 23 disposed on the wiring substrate 91. With such a configuration, the antenna element 95 is electrically connected to the RF device 13 through the wire 23.

The external connection terminal 104 is disposed on a part of the Au layer 42 exposed by the opening portion 97C. The external connection terminal 104 is connected to the wire 94 disposed on the wiring substrate 91. The external connection terminals 103 and 104 are ground terminals.

According to the antenna element of the exemplary embodiment, the radio transceiver 112 is disposed on the upper surface 96A of the silicon substrate 96 with the insulating film 32 interposed therebetween, and the signal input pad 109 and the ground layer 111 are disposed on the lower surface 96B of the silicon substrate 96 with the insulating film 32 interposed therebetween. The connection portion 107 is provided to penetrate the silicon substrate 96, and electrically connects the signal input pad 109 to the radio transceiver 112. Therefore, it is possible to reduce a size of the antenna element 95, as compared with the known antenna element 220 in which the antenna pattern 223 is formed on one surface of the substrate body 211.

In addition, the patch antenna 97 is formed on the silicon substrate 96 (a dielectric constant of silicon is normally about 11) having a larger dielectric constant than a dielectric constant of resin (a dielectric constant of resin is normally about 4). Thus, it is possible to reduce the widths W7 and W8 of the radio transceiver 112, as compared with the case where the patch antenna 97 is formed on a substrate made of resin.

According to a semiconductor device of the embodiment, there are provided the wiring substrate 91 having the wires 21 to 23, 93, and 94, the CPU chip 12 and RF device 13 disposed on the wiring substrate 91 and electrically connected to the wires 21 to 23, and the antenna element 95 electrically con-

Fourth Embodiment

Figure 15:
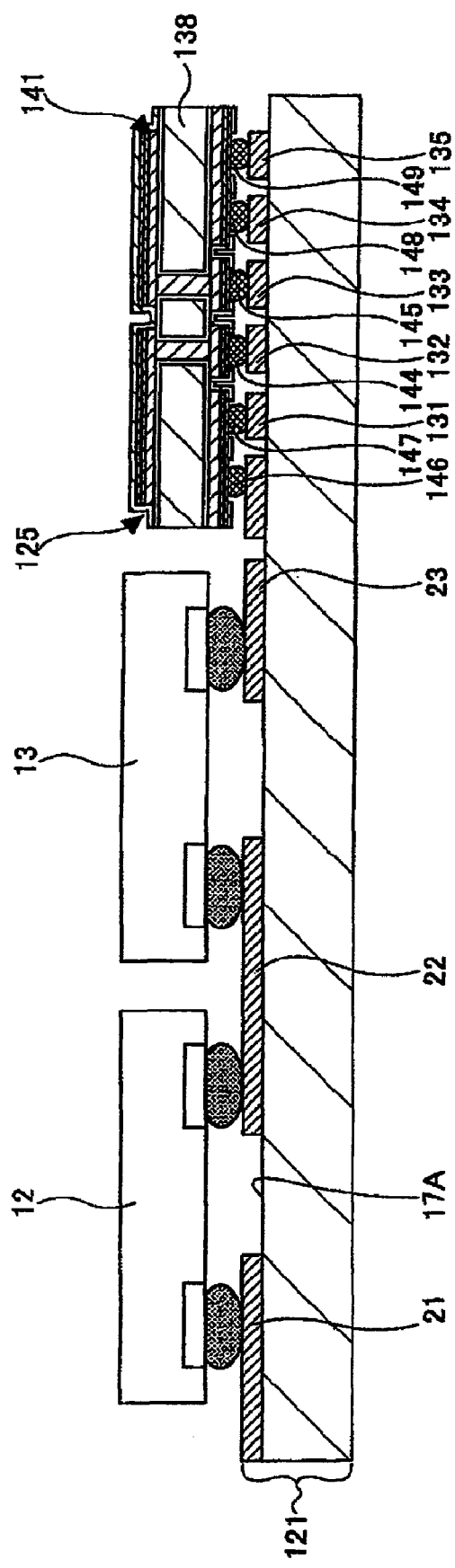
FIG. 15 is a cross-sectional view illustrating a semiconductor device according to a fourth embodiment of the invention.
Figure 19:
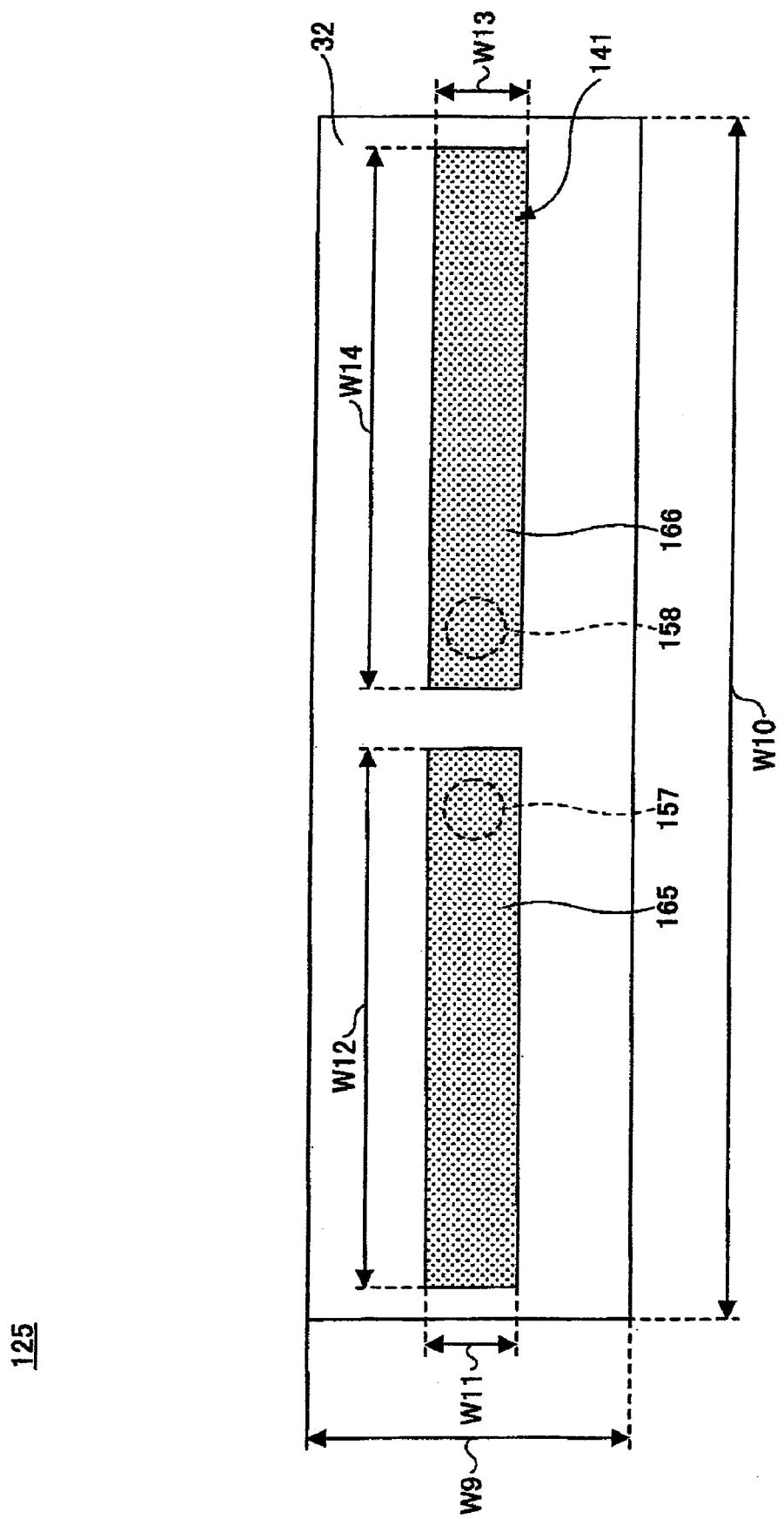

FIG. 15 is a cross-sectional view illustrating a semiconductor device according to a third embodiment of the invention. In FIG. 15, the same elements as the semiconductor device 10 of the first embodiment will be referenced by the same reference numerals and signs.

Referring to FIG. 15, a semiconductor device 120 of the fourth embodiment includes a wiring substrate 121, electronic components such as a CPU chip 12 and a RF device 13, and an antenna element 125.

The wiring substrate 121 has a substrate body 17 and wires 21 to 23 and 131 to 135. The wires 21 to 23 and 131 to 135 are disposed on an upper surface 17A of the substrate body 17. The wiring substrate 121 is a substrate for electrically connecting the CPU chip 12, the RF device 13, and the antenna element 125 to each other.

FIG. 16 is an enlarged sectional view illustrating the antenna element shown in FIG. 15. FIGS. 17 and 18 are top plan views illustrating the antenna element shown in FIG. 16. In FIGS. 16 to 18, the same elements as the antenna element 15 of the first embodiment will be referenced by the same reference numerals and signs. In FIG. 17, a solder resist 37, a Ni layer 35, and an Au layer 36 are not shown for explanatory convenience. In addition, in FIG. 18, a solder resist 143 is not shown for explanatory convenience.

Referring to FIGS. 16 to 18, the antenna element 125 includes a silicon substrate 138, an insulating film 32, a dipole antenna 141 serving as an antenna, Ni layers 35 and 41, Au layers 36 and 42, solder resists 37 and 143, and external connection terminals 144 to 149.

The silicon substrate 138 is formed in a plate shape, and has through holes 152 and 153. The through holes 152 and 153 are formed to penetrate the silicon substrate 138. The through holes 152 and 153 are disposed on a central portion of the silicon substrate 138. A thickness M3 of the silicon substrate 138 may be set to, for example, 200 µm to 500 µm. A width W9 of the silicon substrate 138 may be set to, for example, 1 mm to 10 mm, and in the case of 2.4 GHz, a width W10 of the silicon substrate 138 may be set to, for example, 15 mm.

The insulating film 32 is provided to cover both surfaces 138A and 138B of the silicon substrate 138 and surfaces of the silicon substrate 138 corresponding to the through holes 152 and 153. The insulating film 32 is a used for electrically insulating the dipole antenna 141 from the silicon substrate 138.

The dipole antenna 141 includes connection portions 157 and 158, signal input pads 161 and 162, a ground layer 163, and radio transceivers 165 and 166. The connection portion 157 is disposed in the through hole 152 on which the insulating film 32 is formed. The connection portion 158 is disposed in the through hole 153 on which the insulating film 32 is formed. For example, Cu may be used as a material of the connection portions 157 and 158.

The signal input pad 161 is disposed on a lower end surface of the connection portion 157 and a lower surface of the insulating film 32 (a part of the insulating film 32 that is formed on a lower surface 138B of the silicon substrate 138) in the vicinity thereof. The signal input pad 161 is formed in a circular shape in plan view. The signal input pad 161 is electrically insulated by the groove 169 from the signal input pad 162 and the ground layer 163. The grooves 169 have an 8-shape in plan view, and are formed among the signal input pad 161, the signal input pad 162, and the ground layer 163 each other. The grooves 169 are formed to expose the insulating film 32. The signal input pad 161 is connected to the lower end portion of the connection portion 157. The signal input pad 161 is a pad to which a plus signal is inputted through the external connection terminal 144. For example, Cu may be used as a material of the signal input pad 161.

The signal input pad 162 is disposed on a lower end surface of the connection portion 158 and a lower surface of the insulating film 32 (a part of the insulating film 32 that is formed on a lower surface 138B of the silicon substrate 138) in the vicinity thereof. The signal input pad 162 is formed in a circular shape in plan view. The signal input pad 162 is electrically insulated by the groove 169 from the signal input pad 161 and the ground layer 163. The signal input pad 162 is connected to the lower end portion of the connection portion 158. The signal input pad 162 is a pad to which a minus signal is inputted through the external connection terminal 145. For example, Cu may be used as a material of the signal input pad 162.

The ground layer 163 is separated from the signal input pads 161 and 162, and is provided to cover the lower surface (except for parts of the lower surface of the insulating film 32 corresponding to regions on which the signal input pads 161 and 162 is formed) of the insulating film 32 that is formed on the lower surface 138B (a second surface) of the silicon substrate 138. The ground layer 163 is electrically insulated from the signal input pads 161 and 162. The ground layer 163 is at ground potential. For example, Cu may be used as a material of the ground layer 163.

The radio transceiver 165 is disposed on the insulating film 32 formed on the upper surface 138A (a first surface) of the silicon substrate 138. The radio transceiver 165 is connected to an upper end portion of the connection portion 157. The radio transceiver 165 is electrically connected to the signal input pad 161 through the connection portion 157. The radio transceiver 165 transmits and receives a radio wave. For example, Cu may be used as a material of the radio transceiver 165. When the antenna element 125 is used at a frequency of 2.4 GHz, the width W11 of the radio transceiver 165 may be set to, for example, 1 mm to 10 mm, and the width W12 of the radio transceiver 165 may be set to, for example, 15 mm. In this case, a thickness of the radio transceiver 165 may be set to, for example, 10 µm.

The radio transceiver 166 is disposed on the insulating film 32 formed on the upper surface 138A (a first surface) of the silicon substrate 138. The radio transceiver 166 is connected to an upper end portion of the connection portion 158. The radio transceiver 166 is electrically connected to the signal input pad 162 through the connection portion 158. The radio transceiver 166 has a role to transmit and receive a radio wave. For example, Cu may be used as a material of the radio transceiver 166. When the antenna element 125 is used at a frequency of 2.4 GHz, the width W13 of the radio transceiver 166 may be set by, for example, 1 mm to 10 mm, and the width W14 of the radio transceiver 166 may be set by, for example, 15 mm. In this case, a thickness of the radio transceiver 166 may be set by, for example, 10 µm.

As described above, the radio transceivers 165 and 166 are disposed on the upper surface 138A of the silicon substrate 138 with the insulating film 32 interposed therebetween, and the signal input pads 161 and 162 and the ground layer 163 are disposed on the lower surface 138B of the silicon substrate 138 with the insulating film 32 interposed therebetween. The connection portions 157 and 158 are provided to penetrate the silicon substrate 138. The signal input pad 161 is electrically connected to the radio transceiver 165 by the connection portion 157, and the signal input pad 162 is electrically connected to the radio transceiver 166 by the connection portion 158. Therefore, it is possible to reduce a size of the antenna element 125, as compared with the known antenna element 220 in which the antenna pattern 223 is formed on one surface of the substrate body 211.

In addition, the dipole antenna 141 is formed on the silicon substrate 138 (a dielectric constant of silicon is normally about 11) having a larger dielectric constant than a dielectric constant of resin (a dielectric constant of resin is normally about 4). Thus, it is possible to reduce the widths W11 to W14 of the radio transceivers 165 and 166, as compared with the case where the dipole antenna 141 is formed on a substrate made of resin.

In addition, the dipole antenna 141 is formed on the silicon substrate 138, and thus accuracy in processing the dipole antenna 141 improves, as compared with the case where the dipole antenna 141 is formed on a substrate made of resin. Therefore, it is possible to form the dipole antenna 141 in a desired shape. With such a configuration, it is possible to obtain desired antenna characteristics in the dipole antenna 141. Particularly, it is effective to a case where the antenna element 125 is used in a high frequency band (for example, 60 GHz) and a millimeter frequency band in which size accuracy of antenna is required.

The dipole antenna 141 may be formed of, for example, a Cu plated film. With such a configuration, since the dipole antenna 141 is formed of the plated film, it is possible to improve accuracy (size accuracy) for processing the dipole antenna 141.

A Ni layer 35 is provided to cover the upper surface of the radio transceivers 165 and 166. An Au layer 36 is provided to cover the upper surface of the Ni layer 35. A solder resist 37 is disposed on the insulating film 32 (a part of the insulating film 32 that is formed on an upper surface 138A of the silicon substrate 138) to cover the radio transceivers 165 and 166, the Ni layer 35, and the Au layer 36.

A Ni layer 41 is provided to cover the lower surface of the signal input pads 161 and 162 and the ground layer 163. An Au layer 42 is provided to cover the lower surface of the Ni layer 41. A solder resist 143 is provide to cover parts of the insulating film 32, the ground layer 163, the signal input pads 161 and 162, the Ni layer 41, and the Au layer 42 corresponding to the grooves 169 and the lower surface of the Au layer 42. The solder resist 143 has opening portions 143A to 143F. The opening portion 143A is formed to expose a part of the Au layer 42 formed on the lower surface of the Ni layer 41 disposed on the signal input pad 161. The opening portion 143B is formed to expose a part of the Au layer 42 formed on the lower surface of the Ni layer 41 disposed on the signal input pad 162. The opening portions 143C to 143F are formed to expose parts of the Au layer 42 formed on the lower surface of the Ni layer 41 disposed on the ground layer 163.

The external connection terminal 144 is disposed on a part of the Au layer 42 exposed by the opening portion 143A. The external connection terminal 144 is a terminal for inputting a plus signal. A plus signal inputted from the external connection terminal 144 is transmitted to the radio transceiver 165 through the Au layer 42, the Ni layer 41, the signal input pad 161, and the connection portion 157. In addition, the external connection terminal 144 is connected to the wire 132 disposed on the wiring substrate 121.

The external connection terminal 145 is disposed on a part of the Au layer 42 exposed by the opening portion 143B. The external connection terminal 145 is a terminal for inputting a minus signal. A minus signal inputted from the external connection terminal 145 is transmitted to the radio transceiver 166 through the Au layer 42, the Ni layer 41, the signal input pad 162, and the connection portion 158. In addition, the external connection terminal 145 is connected to the wire 133 disposed on the wiring substrate 121.

The external connection terminal 146 is disposed on a part of the Au layer 42 exposed by the opening portion 143C. The external connection terminal 146 is connected to the wire 23 disposed on the wiring substrate 121. With such a configuration, the antenna element 125 is electrically connected to the RF device 13 through the wire 23. The external connection terminal 147 is disposed on a part of the Au layer 42 exposed by the opening portion 143D. The external connection terminal 147 is connected to the wire 131 disposed on the wiring substrate 121.

The external connection terminal 148 is disposed on a part of the Au layer 42 exposed by the opening portion 143E. The external connection terminal 148 is connected to the wire 134 disposed on the wiring substrate 121. The external connection terminal 149 is disposed on a part of the Au layer 42 exposed by the opening portion 143F. The external connection terminal 149 is connected to the wire 135 disposed on the wiring substrate 121. The external connection terminals 146 to 149 are ground terminals.

According to the antenna element of the embodiment, the radio transceivers 165 and 166 are disposed on the upper surface 138A of the silicon substrate 138 with the insulating film 32 interposed therebetween, and the signal input pads 161 and 162 and the ground layer 163 are disposed on the lower surface 138B of the silicon substrate 138 with the insulating film 32 interposed therebetween. The connection portions 157 and 158 are provided to penetrate the silicon substrate 138. The signal input pad 161 is electrically connected to the radio transceiver 165 by the connection portion 157, and the signal input pad 162 is electrically connected to the radio transceiver 166 by the connection portion 158. Therefore, it is possible to reduce a size of the antenna element 125, as compared with the known antenna element 220 in which the antenna pattern 223 is formed on one surface of the substrate body 211.

In addition, the dipole antenna 141 is formed on the silicon substrate 138 (a dielectric constant of silicon is normally about 11) having a larger dielectric constant than a dielectric constant of resin (a dielectric constant of resin is normally about 4). Thus, it is possible to reduce the widths W11 to W14 of the radio transceivers 165 and 166, as compared with the case where the dipole antenna 141 is formed on a substrate made of resin.

According to a semiconductor device of the embodiment, the wiring substrate 121 having the wires 21 to 23 and 131 to 135, the CPU chip 12 and RF device 13 disposed on the wiring substrate 121 and electrically connected to the wires 21 to 23, and the antenna element 125 electrically connected to the CPU chip 12 and the RF device 13 are provided. Thus, it is possible to reduce a size of the semiconductor device 120.

Although the invention has been described with respect to several preferable embodiments thereof, the invention is not limited to the specific embodiments mentioned above, and may be modified in various forms without departing from the technical spirit described in Claims of the invention.

According to the invention, the invention can be applied to an antenna element and a semiconductor device for which miniaturization is required.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. An antenna element comprising:
a radio transceiver that transmits and receives a radio wave;
a signal input pad;
a ground layer;
a connection portion for electrically connecting the radio transceiver to the ground layer and the signal input pad, wherein the connection portion is directly connected to the signal input pad;
a silicon substrate on which the connection portion, the radio transceiver, the signal input pad, and the ground layer are formed; and
a $SiO_2$ insulating film formed on a first surface and a second surface of the silicon substrate and formed to interpose between the connection portion and the silicon substrate, wherein the $SiO_2$ insulating film is for electrically insulating the silicon substrate from the connection portion, the radio transceiver, the signal input pad, and the ground layer;
a solder resist formed around the radio transceiver, the signal input pad, and the ground layer,
wherein the radio transceiver is disposed on the first surface of the silicon substrate with the $SiO_2$ insulating film interposed therebetween, and
wherein the ground layer and the signal input pad are disposed on the second surface of the silicon substrate opposite to the first surface thereof with the $SiO_2$ insulating film interposed therebetween, and wherein the signal input pad and the ground layer are on a same plane, and
wherein the connection portion is disposed to penetrate the silicon substrate with the $SiO_2$ insulating film interposed between the connection portion and the silicon substrate.

2. An antenna element comprising:
a radio transceiver that transmits and receives a radio wave;
a signal input pad;
a ground layer;
a connection portion for electrically connecting the radio transceiver to the signal input pad, wherein the connection portion is directly connected to the signal input pad;
a silicon substrate on which the connection portion, the radio transceiver, the signal input pad, and the ground layer is formed; and
a $SiO_2$ insulating film formed on a first surface and a second surface of the silicon substrate and formed to interpose between the connection portion and the silicon substrate, wherein the $SiO_2$ insulating film is for electrically insulating the silicon substrate from the connection portion, the radio transceiver, the signal input pad, and the ground layer;
a solder resist formed around the radio transceiver, the signal input pad, and the ground layer,
wherein the radio transceiver is disposed on the first surface of the silicon substrate with the $SiO_2$ insulating film interposed therebetween, and
wherein the ground layer and the signal input pad are disposed on the second surface of the silicon substrate opposite to the first surface thereof with the $SiO_2$ insulating film interposed therebetween, and wherein the signal input pad and the ground layer are on a same plane, and
wherein the connection portion is disposed to penetrate the silicon substrate with the $SiO_2$ insulating film interposed between the connection portion and the silicon substrate.

3. The antenna element according to claim 1 or 2, wherein the connection portion, the radio transceiver, the signal input pad, and the ground layer is formed of a plated film.

4. A semiconductor device comprising:
the antenna element according to any one of claims 1 to 2;
an electronic component that is electrically connected to the antenna element; and
a wiring substrate on which the antenna element and the electronic component are mounted.

* * * * *